US008724406B2

(12) United States Patent
Tseng et al.

(10) Patent No.: US 8,724,406 B2
(45) Date of Patent: May 13, 2014

(54) BIDIRECTIONAL SHIFT REGISTER AND THE DRIVING METHOD THEREOF

(75) Inventors: Chien-Chang Tseng, Hsin-Chu (TW); Kuang-Hsiang Liu, Hsin-Chu (TW); Yu-Hsin Ting, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 162 days.

(21) Appl. No.: 13/524,070

(22) Filed: Jun. 15, 2012

(65) Prior Publication Data

US 2013/0173870 A1 Jul. 4, 2013

(30) Foreign Application Priority Data

Dec. 29, 2011 (TW) ............................. 100149595 A

(51) Int. Cl.
*G11C 7/00* (2006.01)

(52) U.S. Cl.
USPC ............ 365/189.12; 365/189.18; 365/189.05; 365/189.08; 345/100

(58) Field of Classification Search
USPC ............. 365/189.12, 189.18, 189.05, 189.08; 345/100
See application file for complete search history.

(56) References Cited

U.S. PATENT DOCUMENTS

| | | | | |
|---|---|---|---|---|
| 7,800,576 | B2 * | 9/2010 | Jinta ............................. | 345/100 |
| 7,868,868 | B2 * | 1/2011 | Kim et al. ...................... | 345/100 |
| 8,497,832 | B2 * | 7/2013 | Chiu et al. .................... | 345/100 |

* cited by examiner

*Primary Examiner* — Fernando Hidalgo
(74) *Attorney, Agent, or Firm* — WPAT, PC; Justin King

(57) ABSTRACT

A bidirectional shift register includes a first register circuit and a second register circuit. The first register circuit includes a first register stage and a first output buffer stage with n numbers of scanning signal output ends. The first register stage is electrically coupled to a third voltage source. The first output buffer stage is electrically coupled to a second voltage source and a first voltage source. The second register circuit has a similar circuit structure to the first register circuit; wherein the first register circuit and the second register circuit each use n+1 numbers clock signal lines, and the n is a positive integer.

16 Claims, 18 Drawing Sheets

BIDIRECTIONAL SHIFT REGISTER AND THE DRIVING METHOD THEREOF

TECHNICAL FIELD

The present disclosure relates to a shift register, and more particularly to a bidirectional shift register and a driving method thereof.

BACKGROUND

In the present manufacture process of liquid crystal display (LCD), some manufacturers use the gate driver on array (GOA) technique to manufacture shift registers; and thus, the dependence on the mass materials of drive integrated circuit for the LCD panel can be avoided and consequently the manufactured shift registers can have a compact (for example, a lighter, thinner, shorter and smaller) design.

Several various types of thin film transistors (TFT) can be used in the GOA for the manufacture of the shift registers, and each type of TFT has specific advantages and disadvantages. For example, the amorphous silicon thin film transistor (a-si TFT) has a better homogeneity but has a relatively poor electro-mobility; and thus, the required layout area is relatively large if the a-si TFTs are adopted for the manufacture of the shift registers. Today, the amorphous indium gallium zinc oxide thin film transistors (a-IGZO TFT), having an electro-mobility higher than the a-si TFT has, have been widely used in the GOA for the manufacture of the shift registers. However, both the a-si TFT and the a-IGZO TFT have specific problems while being as one of the circuit component in the GOA.

For example, due to the characteristic of the a-si TFT or the a-IGZO TFT, a biased turned-off voltage may occur while the GOA is turned-off (the turned-off voltage of TFT is about 0V), and the biased turned-off voltage may further result in a higher current leakage, the ripple issues or even cause the shift register having an unexpected output. Moreover, due to the current leakage of the TFTs, the GOA may have reduced recharge ability while the GOA is turned-on. Although the current leakage and the ripple issues can be avoided by increasing the number of the voltage regulator circuit in the shift register, due to the shift register accordingly has a relatively large circuit layout area and a higher cost; and thus, the shift register cannot have a compact design.

SUMMARY OF DISCLOSURE

One object of the present disclosure is to provide a bidirectional shift register and a driving method thereof. Specifically, the bidirectional shift register can be operated in bidirectional through being configured to have a symmetrical circuit structure and a specific signal control sequence. In addition, the current-leakage path can be blocked while the output buffer stage of the bidirectional shift register is operated in a reverse biased status; and consequently the bidirectional shift register can have a smaller circuit layout area and higher stability.

Therefore, the bidirectional shift register of the present disclosure includes a first register circuit and a second register circuit. The first register circuit includes a first register stage and a first output buffer stage. The first register stage has a first end, a second end and an output end; wherein the first end of the first register stage is electrically coupled to an output end of a second register stage of a previous-stage bidirectional shift register, the first register stage is configured to receive a first control signal, a second control signal and an end stage clock signal, the first register stage is electrically coupled to a third voltage source. The first output buffer stage is electrically coupled to the first register stage, And having a first end, a second end and n numbers of scanning signal output ends, wherein the first end of the first output buffer stage is electrically coupled to the first end of the first register stage, the second end of the first output buffer stage is electrically coupled to the second end of the first register stage, the first output buffer stage is further electrically coupled to a first voltage source and a second voltage source.

The second register circuit includes a second register stage and a second output buffer stage. The second register stage has a first end, a second end and an output end; wherein the first end of the second register stage is electrically coupled to the output end of the first register stage, the second end of the second register stage is electrically coupled to an output end of a first register stage of a next-stage bidirectional shift register. The second register stage is configured to receive the first control signal, the second control signal and a complementary end stage clock signal. The second register stage is further electrically coupled to the third voltage source. The second output buffer stage is electrically coupled to the second register stage, and having a first end, a second end and n numbers of scanning signal output ends, wherein the first end of the second output buffer end is electrically coupled to the first end of the second register stage, the second end of the second output buffer stage is electrically coupled to the second end of the second register stage and an output end of a first register stage of a next-stage bidirectional shift register. The second output buffer stage is electrically coupled to the second voltage source and the first voltage source; wherein the first register circuit and the second register circuit each use n+1 numbers of clock signal lines, and the n is a positive integer.

Moreover, a driving method of a bidirectional shift register of the present disclosure for driving a plurality of bidirectional shift registers therein, each bidirectional shift register includes a first register circuit and a second register circuit, the driving method includes: providing a first voltage source, a second voltage source, a third voltage source, a first control signal and a second control signal; defining the first register circuit into a first register stage and a first output buffer stage with n numbers of scanning signal output ends, and defining the second register circuit into a second register stage and a second output buffer stage with n numbers of scanning signal output ends; and electrically coupling the first end of the first register stage and the output end of the second register stage of a previous-stage bidirectional shift register; electrically coupling the first register stage to the third voltage source; configuring the first register stage to receive the first control signal, the second control signal and a complementary nth clock signal; electrically coupling the first end of the first output buffer stage to the first end of the first register stage; electrically coupling the second end of the first output buffer stage to the second end of the first register stage; electrically coupling the first output buffer stage, the second voltage to the first voltage source; electrically coupling the first end of the second register stage to the output end of the first register stage; electrically coupling the second end of the second register stage to the output end of the first register of the next-stage bidirectional shift register; electrically coupling the second register stage to the third voltage source; configuring the second register stage to receive the first control signal, the second control signal and a nth clock signal; electrically coupling the first end of the second output buffer stage to the first end of the second register stage; electrically coupling the second end of the second output buffer stage to the second end of the first register stage; electrically coupling the output end of the second register stage to the second end of the first register stage and the first end of the first register stage of a next-stage bidirectional shift register; electrically coupling the second output buffer stage, the second voltage source to the first voltage source; wherein the first register circuit and the second register circuit each use n+1 numbers of clock signal lines and n is a positive integer.

In summary, through the symmetrical circuit structure and the specific signal control sequence, the bidirectional shift register and the driving method thereof according to the present disclosure have a bidirectional operation feature. In addition, the bidirectional shift register according to the present disclosure has lower power consumption and a smaller layout area due to the register stage using one clock signal line only. Moreover, because the leakage current path can be blocked when the output buffer stage is operated in a reverse biased status, and consequently the bidirectional shift register according to the present disclosure has a higher stability.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
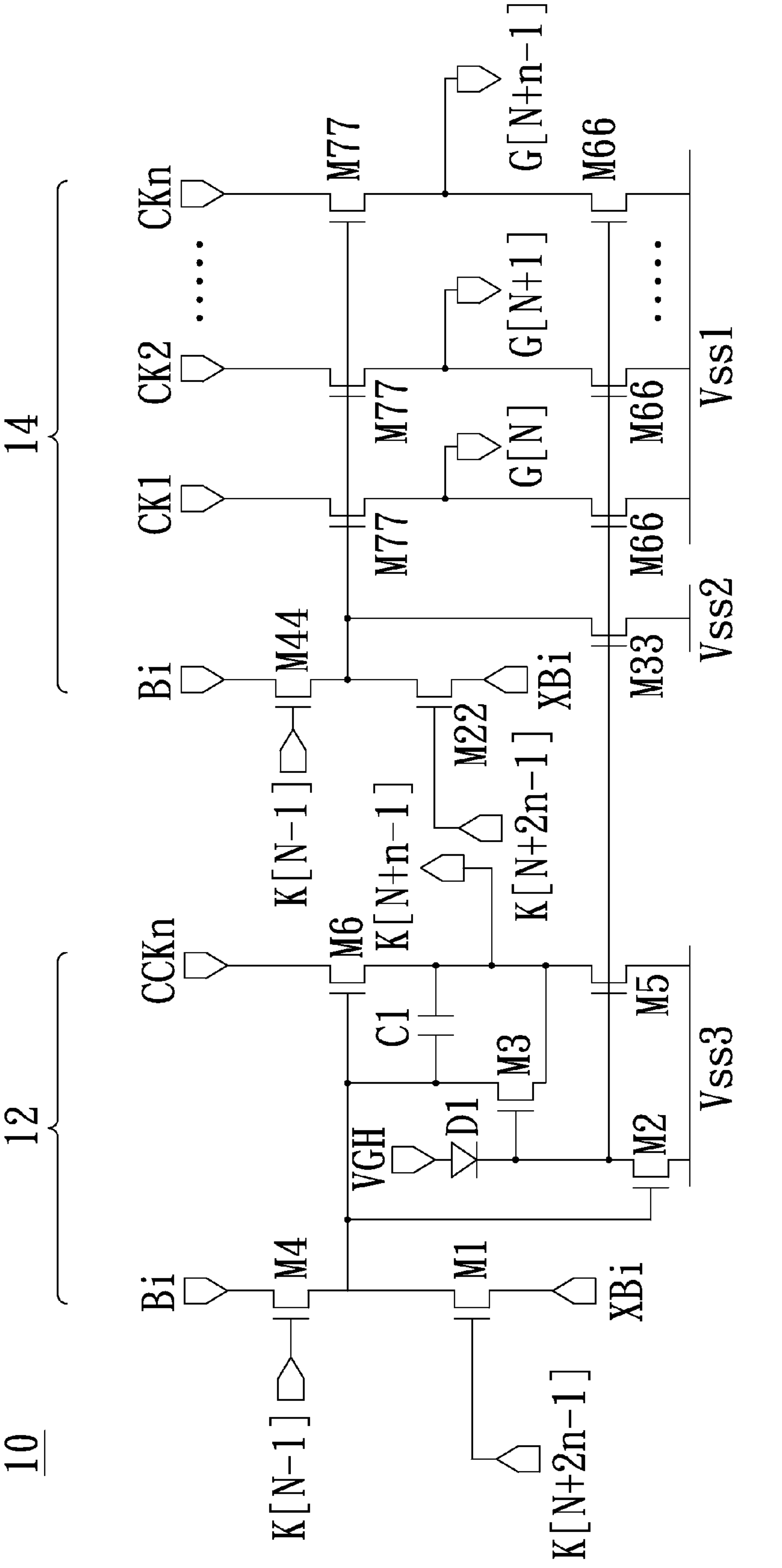
FIG. 1A is a schematic circuit view of a first register circuit adopted in a bidirectional shift register in accordance with a first embodiment of the present disclosure.
Figure 1B:
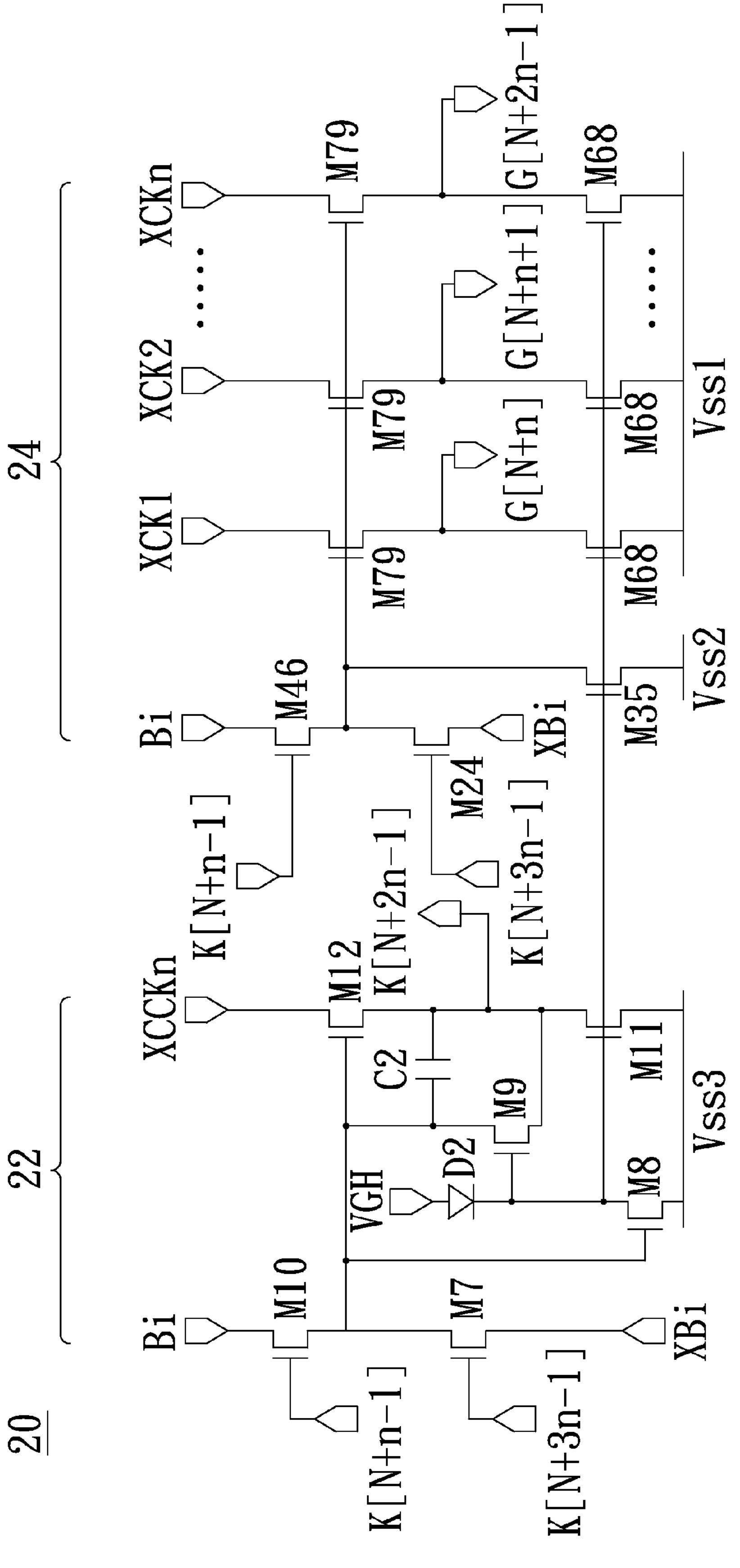
FIG. 1B is a schematic circuit view of a second register circuit adopted in the bidirectional shift register of the first embodiment.

FIG. 1A is a schematic circuit view of a first register circuit adopted in a bidirectional shift register in accordance with a first embodiment of the present disclosure; and FIG. 1B is a schematic circuit view of a second register circuit adopted in the bidirectional shift register of the first embodiment. In particular, the bidirectional shift register in this embodiment can be manufactured by the amorphous silicon thin film transistor (a-si TFT) process or the amorphous indium gallium zinc oxide thin film transistor (a-IGZO TFT) process.

As shown in FIG. 1A, the first register circuit 10 according to the first embodiment of the present disclosure includes a first register stage 12 and a first output buffer stage 14.

The first register stage 12 has a first end, a second end and an output end. The first end of the first register stage 12 is electrically coupled to an output end (indicated as K[N−1] in FIG. 1A) of a second register stage of a previous-stage bidirectional shift register (not shown). The second end of the first register stage 12 is electrically coupled to an output end (indicated as K[N+2n−1] in FIGS. 1A, 1B) of the second register stage 22 shown in FIG. 1B. The first register stage 12 is configured to receive a first control signal Bi, a second control signal XBi and an end stage clock signal CCKn; wherein the first control signal Bi and the second control signal XBi are complementary to each other. In addition, the first register stage 12 is further electrically coupled to a third voltage source Vss3. It is to be noted that the end stage clock signal CCKn and a nth clock signal Ckn are configured to have a same phase but have a different low logic level. For example, in this embodiment the low logic level of the end stage clock CCKn is equal to the level of the third voltage source Vss3 and the low logic level of the nth clock signal Ckn is equal to the level of a first voltage source Vss1.

Specifically, the first register stage 12 includes transistors M1~M6, a diode D1 and a capacitor C1. The transistors M1~M6 each are an n-type transistor, and no limitation. The transistor M1 has a drain terminal, a gate terminal and a source terminal; wherein the gate terminal of the transistor M1 is electrically coupled to the output end K[N+2n−1] of the second register stage 22, and the source terminal of the transistor M1 is configured to receive the second control signal XBi. The transistor M2 has a drain terminal, a gate terminal and a source terminal; wherein the gate terminal of the transistor M2 is electrically coupled to the source terminal of the transistor M1, and the source terminal of the transistor M2 is electrically coupled to the third voltage source Vss3. The transistor M3 has a drain terminal, a gate terminal and a source terminal; wherein the drain terminal of the transistor M3 is electrically coupled to the drain terminal of the transistor M2, and the gate terminal of the transistor M3 is electrically coupled to the drain terminal of the transistor M2. The transistor M4 has a drain terminal, a gate terminal and a source terminal; wherein the drain terminal of the transistor M4 is configured to receive the first control signal Bi, the gate terminal of the transistor M4 is electrically coupled to the output end K[N−1] of the second register stage of the previous-stage bidirectional shift register, and the source terminal of the transistor M4 is electrically coupled to the drain terminal of the transistor M1.

The transistor M5 has a drain terminal, a gate terminal and a source terminal; wherein the drain terminal of the transistor M5 is electrically coupled to the source terminal of the transistor M3, the gate terminal of the transistor M5 is electrically coupled to the drain terminal of the transistor M2, and the source terminal of the transistor M5 is electrically coupled to the voltage source Vss3. The transistor M6 has a drain terminal, a gate terminal and a source terminal; wherein the drain terminal of the transistor M6 is configured to receive the end stage clock signal CCKn, the gate terminal of the transistor M6 is electrically coupled to the drain terminal of the transistor M3, and the source terminal of the transistor M6 is electrically coupled to the drain terminal of the transistor M5, the output end of the first register stage 12 and the first end K[N+n−1] of the second register stage 22. The diode D1 has a positive end and a negative end; wherein the positive end of the diode D1 is configured to receive a first voltage VGH, and the negative end of the diode D1 is electrically coupled to the gate terminal of the transistor M3 and the drain terminal of the transistor M2. The capacitor C1 has a first end and a second end; wherein the first end of the capacitor C1 is electrically coupled to the source terminal of the transistor M3, and the second end of the capacitor C1 is electrically coupled to the drain terminal of the transistor M3. It is to be noted that the capacitor C1 can be omitted in another embodiment of the present disclosure. Moreover, the bidirectional shift register of the present disclosure can have a smaller circuit layout area due to the first register stage 12 thereof uses one clock signal line only for receiving clock signal.

As shown in FIG. 1A, the first output buffer stage 14 is electrically coupled to the first register stage 12 and configured to receive the first control signal Bi, the second control signal XBi, a first clock signal CK1, a second clock signal CK2, . . . a nth clock signal CKn. The first output buffer stage 14 has a first end, a second end and n numbers of scanning signal output ends G[N], G[N+1] . . . , G[N+n−1]. The first end of the first output buffer stage 14 is electrically coupled to the output end K[N−1] of the second register stage of the previous-stage bidirectional shift register (not shown); in other words, the first end of the first output buffer stage 14 is also electrically coupled to the first end of the first register stage 12. The second end of the first output buffer stage 14 is electrically coupled to the output end K[N+2n−1] of the second register stage 22 (shown in FIG. 1B); in other words, the second end of the first output buffer stage 14 is also electrically coupled to the second end of the first register stage 12. Moreover, the first output buffer stage 14 is electrically coupled to the second voltage source Vss2 and the first voltage source Vss1; wherein the first voltage source Vss1 is configured to have a voltage level greater than the second voltage source Vss2 has, the first voltage source Vss2 is configured to have a voltage level greater than the second voltage source Vss3 has, and the first voltage source Vss3 is configured to have a voltage level greater than the first voltage VGH has.

Specifically, the first output buffer stage 14 includes a transistor M22, a transistor M33, a transistor M44, a plurality of transistors M66 and a plurality of transistors M77. The transistors M22, M33, M44, M66 and M77 each are an n-type transistor, and no limitation. The transistor M22 has a drain terminal, a gate terminal and a source terminal; wherein the gate terminal of the transistor M22 is electrically coupled to the output end K[N+2n−1] of the second register stage 22 (or, the second end of the first register stage 12), and the source terminal of the transistor M22 is configured to receive the second control signal XBi. The transistor M33 has a drain terminal, a gate terminal and a source terminal; wherein the drain terminal of the transistor M33 is electrically coupled to the drain terminal of the transistor M22, the gate terminal of the transistor M33 is electrically coupled to the gate terminal of the transistor M5 of the first register stage 12, and the source terminal of the transistor M33 is electrically coupled to the second voltage source Vss2. The transistor M44 has a drain terminal, a gate terminal and a source terminal; wherein the drain terminal of the transistor M44 is configured to receive the first control signal Bi, the gate terminal of the transistor M44 is electrically coupled to the output end K[N−1] of the second register stage of the previous-stage bidirectional shift register (or, electrically coupled to the first end of the first register stage 12), and the source terminal of the transistor M44 is electrically coupled to the drain terminal of the transistor M33.

Based on the aforementioned description of the first output buffer stage 14, it is to be noted that the output signal outputted from each one of the scanning signal output ends G[N], G[N+1] . . . , G[N+n−1] is controlled by its associated pair transistors M66, M77. In addition, the gate terminal of each transistor M66 is electrically coupled to the gate terminal of the transistor M33; the source terminal of each transistor M66 is electrically coupled to the first voltage source Vss1. The drain terminals of the n numbers of transistor M77 are configured to receive the first clock signal CK1, the second clock signal CK2, . . . and the nth clock signal CKn, respectively; the gate terminal of each transistor M77 is electrically coupled to the source terminal of the transistor M44; and the source terminal of each transistor M77 is electrically coupled to the drain terminal of its associated transistor M66. In this embodiment, the first clock signal CK1, the second clock signal CK2, . . . and the nth clock signal CKn each are configured to have a pulse width proportional to the stage number (that is, the number n) of the first output buffer stage 14. Moreover, the source terminal of the transistor M77 associated with the first clock signal CK1 is electrically coupled to the scanning signal output end G[N]; the source terminal of the transistor M77 associated with the second clock signal CK2 is electrically coupled to the scanning signal output end G[N+1]; and based on the same manner, the source terminal of the transistor M77 associated with the nth clock signal CKn is electrically coupled to the scanning signal output end G[N+1].

As shown in FIG. 1B, the second register circuit 20 according to the first embodiment of the present disclosure includes a second register stage 22 and a second output buffer stage 24. The second register stage 22 has a first end, a second end and an output end. The first end of the second register stage 22 is electrically coupled to the output end (indicated as K[N+n−1] in FIG. 1B) of the first register stage 12. The second end of the second register stage 22 is electrically coupled to an output end (indicated as K[N+3n−1] in FIG. 1B) of the first register stage of the next-stage bidirectional shift register. The output end of the second register stage 22 is electrically coupled to the second end of the first register stage 12 and the first end (not shown) of the first register stage of the next-stage bidirectional shift register. The second register stage 22 is configured to receive the first control signal Bi, the second control signal XBi and a complementary end stage clock signal XCCKn. In addition, the second register stage 22 is further electrically coupled to a third voltage source Vss3.

Specifically, the second register stage 22 includes transistors M7~M12, a diode D2 and a capacitor C2. The transistors M7~M12 each are an n-type transistor, and no limitation. The transistor M7 has a drain terminal, a gate terminal and a source terminal; wherein the gate terminal of the transistor M7 is electrically coupled to the output end K[N+3n−1] of the first register stage of the next-stage bidirectional shift register, and the source terminal of the transistor M7 is configured to receive the second control signal XBi. The transistor M8 has a drain terminal, a gate terminal and a source terminal; wherein the gate terminal of the transistor M8 is electrically coupled to the source terminal of the transistor M7, and the source terminal of the transistor M8 is electrically coupled to the third voltage source Vss3. The transistor M9 has a drain terminal, a gate terminal and a source terminal; wherein the drain terminal of the transistor M9 is electrically coupled to the drain terminal of the transistor M8. The transistor M10 has a drain terminal, a gate terminal and a source terminal; wherein the drain terminal of the transistor M10 is configured to receive the first control signal Bi, the gate terminal of the transistor M10 is electrically coupled to the output end K[N+n−1] of the first register stage 12, and the source terminal of the transistor M10 is electrically coupled to the drain terminal of the transistor M7.

The transistor M11 has a drain terminal, a gate terminal and a source terminal; wherein the drain terminal of the transistor M11 is electrically coupled to the source terminal of the transistor M9, the gate terminal of the transistor M11 is electrically coupled to the drain terminal of the transistor M8, and the source terminal of the transistor M11 is electrically coupled to the voltage source Vss3. The transistor M12 has a drain terminal, a gate terminal and a source terminal; wherein the drain terminal of the transistor M12 is configured to receive the complementary end stage clock signal XCCKn, the gate terminal of the transistor M12 is electrically coupled to the drain terminal of the transistor M9, and the source terminal of the transistor M12 is electrically coupled to the drain terminal of the transistor M11 and the output end K[N+2n−1] of the second register stage 22. The diode D2 has a positive end and a negative end; wherein the positive end of the diode D2 is configured to receive the first voltage VGH, and the negative end of the diode D2 is electrically coupled to the gate terminal of the transistor M9 and the drain terminal of the transistor M8. The capacitor C2 has a first end and a second end; wherein the first end of the capacitor C2 is electrically coupled to the source terminal of the transistor M12, and the second end of the capacitor C2 is electrically coupled to the drain terminal of the transistor M9. It is to be noted that the capacitor C2 can be omitted in another embodiment of the present disclosure. Moreover, the bidirectional shift register of the present disclosure can have a small circuit layout area due to the second register stage 22 thereof uses one clock signal line for receiving the clock signal.

As shown in FIG. 1B, the second output buffer stage 24 is electrically coupled to the second register stage 22 and configured to receive the first control signal Bi, the second control signal XBi, a first clock signal CK1, a second clock CK2, . . . a nth clock signal CKn. The second output buffer stage 24 has a first end, a second end and n numbers of scanning signal output ends G[N+n], G[N+n+1] . . . , G[N+2n−1]. The first end of the second output buffer stage 24 is electrically coupled to the output end K[N+n−1] of the first register stage 12; in other words, the first end of the second output buffer stage 24 is also electrically coupled to the first end of the second register stage 22. The second end of the second output buffer stage 24 is electrically coupled to the output end K[N+3n−1] of the first register stage of the next-stage bidirectional shift register (not shown); in other words, the second end of the second output buffer stage 24 is also electrically coupled to the second end of the second register stage 22. Moreover, the second output buffer stage 24 is electrically coupled to the second voltage source Vss2 and the first voltage source Vss1.

Specifically, the second output buffer stage 24 includes a transistor M24, a transistor M35, a transistor M46, a plurality of transistors M68 and a plurality of transistors M79. The transistors M24, M35, M46, M68 and M79 each are an n-type transistor, and no limitation. The transistor M24 has a drain terminal, a gate terminal and a source terminal; wherein the gate terminal of the transistor M24 is electrically coupled to the output end K[N+3n−1] of the first register stage of the next-stage bidirectional shift register (or, electrically coupled to the second end of the second register stage 22), and the source terminal of the transistor M24 is configured to receive the second control signal XBi. The transistor M35 has a drain terminal, a gate terminal and a source terminal; wherein the drain terminal of the transistor M35 is electrically coupled to the drain terminal of the transistor M24, the gate terminal of the transistor M35 is electrically coupled to the gate terminal of the transistor M11 of the second register stage 22, and the source terminal of the transistor M35 is electrically coupled to the second voltage source Vss2. The transistor M46 has a drain terminal, a gate terminal and a source terminal; wherein the drain terminal of the transistor M46 is configured to receive the first control signal Bi, the gate terminal of the transistor M46 is electrically coupled to the output end K[N+n−1] of the first register stage 12, and the source terminal of the transistor M46 is electrically coupled to the drain terminal of the transistor M35.

Base on the aforementioned description of the second output buffer stage 24, it is to be noted that the output signal outputted from each one of the scanning signal output ends G[N+n], G[N+n+1] . . . , G[N+2n−1] is controlled by its associated pair the transistors M68, M79. In addition, the gate terminal of each transistor M68 is electrically coupled to the gate terminal of the transistor M35; the source terminal of each transistor M68 is electrically coupled to the first voltage source Vss1. The drain terminals of the n numbers of transistor M79 are configured to receive the complementary first clock signal XCK1, the complementary second clock signal XCK2, . . . and the complementary nth clock signal XCKn; the gate terminal of each transistor M79 is electrically coupled to the source terminal of the transistor M46; and the source terminal of each transistor M79 is electrically coupled to the drain terminal of its associated transistor M68. In this embodiment, the complementary first clock signal XCkl, the complementary second clock signal XCK2, . . . and the complementary nth clock signal XCKn each are configured to have a pulse width proportional to the stage number (that is, the number n) of the second output buffer stage 24. Moreover, the source terminal of the transistor M79 associated with the complementary first clock signal XCK1 is electrically coupled to the scanning signal output end G[N+n]; the source terminal of the transistor M79 associated with the complementary second clock signal XCK2 is electrically coupled to the scanning signal output end G[N+n+1]; and base on the same manner, the source terminal of the transistor M79 associated with the complementary nth clock signal XCKn is electrically coupled to the scanning signal output end G[N+2n−1].

Following is the description of the main characteristics of the first embodiment of the present disclosure. The transistors M22, M44 and M77 are operated in a reverse biased status while the first output buffer stage 14 is turned-off. Similarly, the transistors M24, M46 and M79 are operated in a reverse biased status while the second output buffer stage 24 is turned-off. And thus, the current leakage issue in the prior art is avoided and the noise interference is eliminated, and consequently the bidirectional shift register in the first embodiment can have a reduced-size voltage regulator element therein. In addition, the transistors M22, M33 and M66 are configured to block the current-leakage path while the first output buffer stage 14 is turned-on. Similarly, the transistors M24, M35 and M68 are configured to block the current-leakage path while the second output buffer stage 24 is turned-on. And thus, the bidirectional shift register in the first embodiment can have a higher stability and lower power consumption.

Figure 2A:
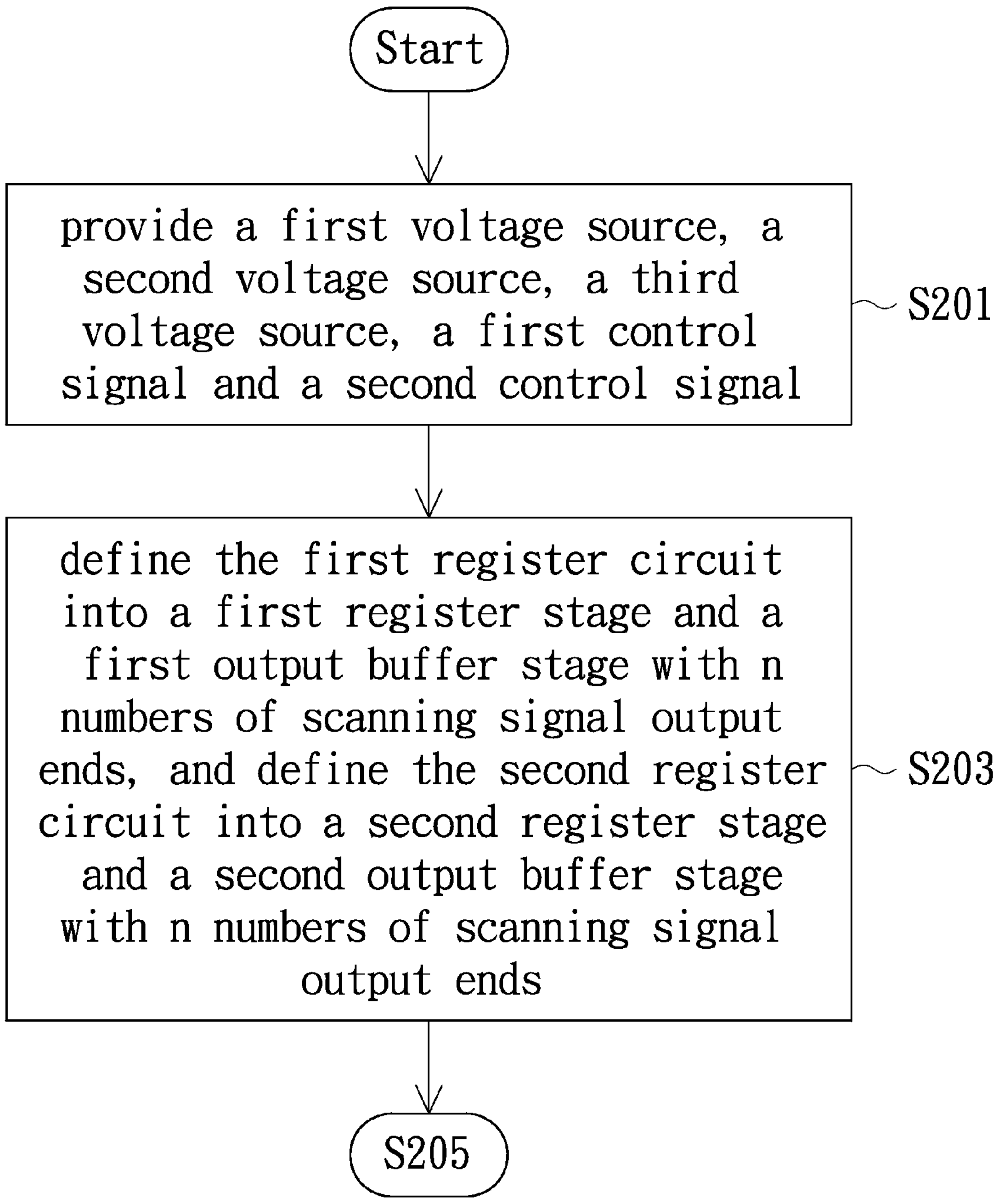
FIGS. 2A, 2B are flow charts illustrating a driving method for the bidirectional shift register in the first embodiment.
Figure 2B:
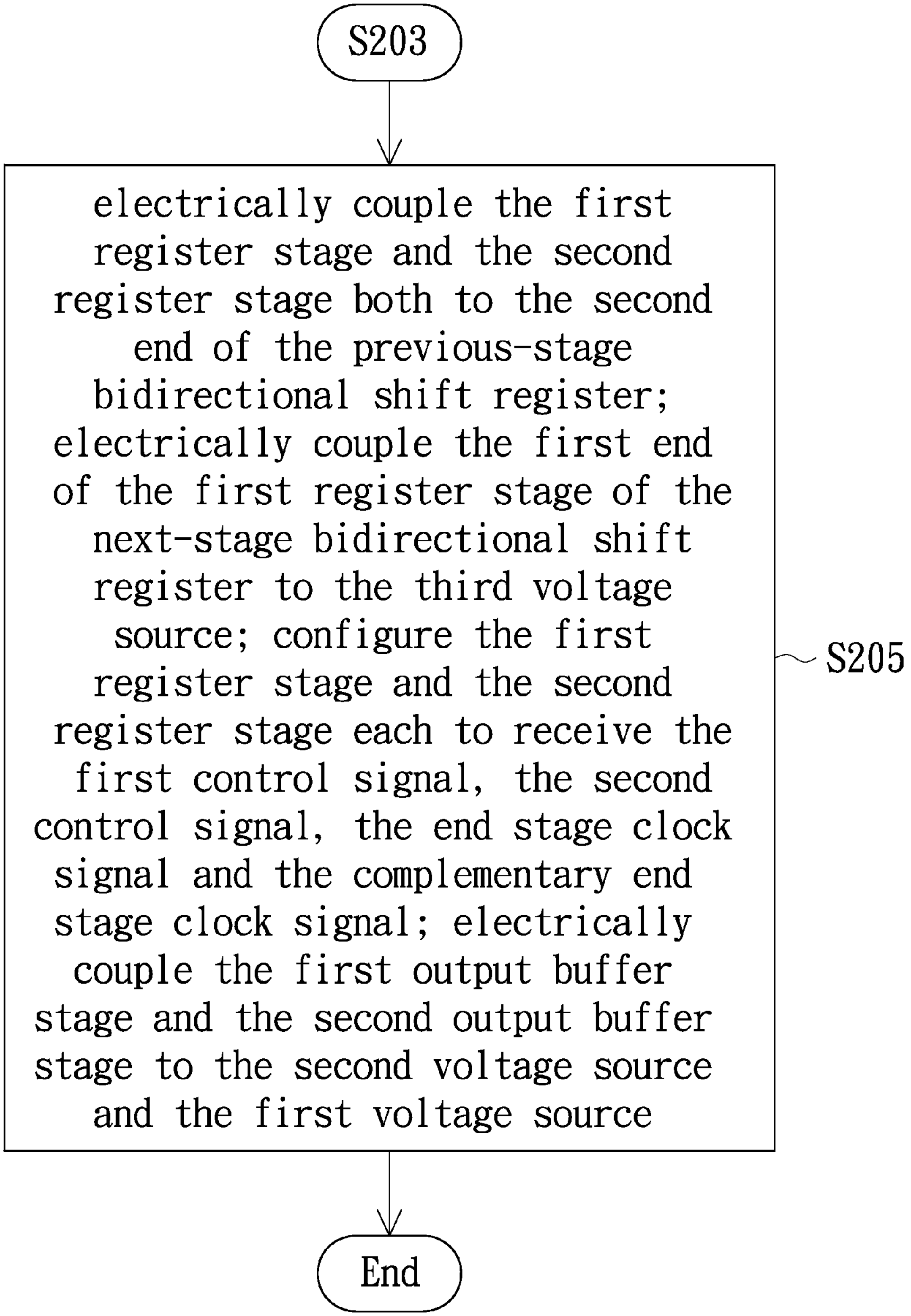

FIGS. 2A, 2B are flow charts illustrating a driving method for the bidirectional shift register in the first embodiment. Please refer to FIGS. 1A, 1B, 2A and 2B. Firstly, the first voltage source Vss1, the second voltage source Vss2, the third voltage source Vss3, the first control signal Bi and the second control signal XBi are provided (step S201); wherein the first voltage source Vss1 is configured to have a voltage level greater than that of the second voltage source Vss2, the second voltage source Vss2 is configured to have a voltage level greater than that of the third voltage source Vss3, the second control signal XBi and the first control signal Bi are complementary to each other.

Then, the first register circuit 10 is defined into the first register stage 12 and the first output buffer stage 14 with n numbers of scanning signal output end; and the second register circuit 20 is defined into the second register stage 22 and the second output buffer stage 24 with n numbers of scanning signal output end (step S203). Herein, the first output buffer stage 14 is configured to receive the first control signal Bi, the second control signal XBi and the first clock signal CK1, the second clock signal CK2, . . . and the nth clock signal CKn; the second output buffer stage 24 is configured to receive the first control signal Bi, the second control signal XBi and the complementary first clock signal XCK1, the complementary second clock signal XCK2, . . . and the complementary nth clock signal XCKn. Besides, the first clock signal CK1, the second clock signal CK2, . . . and the nth clock signal CKn each are configured to have a pulse width proportional to the stage numbers of the first output buffer stage 14; and the complementary first clock signal XCK1, the complementary second clock signal XCK2, . . . and the complementary nth clock signal XCKn each are configured to have a pulse width proportional to the stage numbers of the second output buffer stage 24.

Then, the first register stage 12 and the second register stage 22 are electrically coupled to the second end of the previous-stage bidirectional shift register, the first end of the first register stage of the next-stage bidirectional shift register and the third voltage source Vss3; the first register stage 12 and the second register stage 22 each are configured to receive the first control signal Bi, the second control signal XBi, the end stage clock signal CCKn and the complementary end stage clock signal XCCKn; the first output buffer stage 14 and the second output buffer stage 16 are electrically coupled to the second voltage source Vss2 and the first voltage source Vss1 (step S205). More specifically, the first end of the first register stage 12 is electrically coupled to the output end K[N−1] of the second register stage of the previous-stage bidirectional shift register; the second end of the first register stage 12 is electrically coupled to the output end K[N+2n−1] of the second register stage 22; the first register stage 12 is electrically coupled to the third voltage source Vss3; the first register stage 12 is configured to receive the first control signal Bi, the second control signal XBi and the end stage clock signal CCKn; the first end of the first output buffer stage 14 is electrically coupled to the output end K[N−1] of the second register stage of the previous-stage-bidirectional shift register (or, electrically coupled to the first end of the first register stage 12); the first output buffer stage 14 is electrically coupled to the second voltage source Vss2 and the first voltage source Vss1; the first end of the second register stage 22 is electrically coupled to the output end K[N+n−1] of the first register stage 12; the second end of the second register stage 22 is electrically coupled to the output end K[N+3n−1] of the first register of the next-stage bidirectional shift register; the second register stage 22 is electrically coupled to the third voltage source Vss3; the second register stage 22 is configured to receive the first control signal Bi, the second control signal XBi and the complementary end stage clock signal XCCKn; the first end of the second output buffer stage 24 is electrically coupled to the output end K[N+n−1] of the first register stage 12 (or, electrically coupled to the first end of the second register stage 22); the second end of the second output buffer stage 24 is electrically coupled to the output end K[N+3n−1] of the first register stage of the next-stage bidirectional shift register (or, electrically coupled to the second end of the second register stage 22); and the second output buffer stage 24 is electrically coupled to the second voltage source Vss2 and the first voltage source Vss1. Besides, the first register circuit 10 and the second register circuit 20 each use n+1 clock signal lines; wherein N and n each are a positive integer.

Figure 3A:
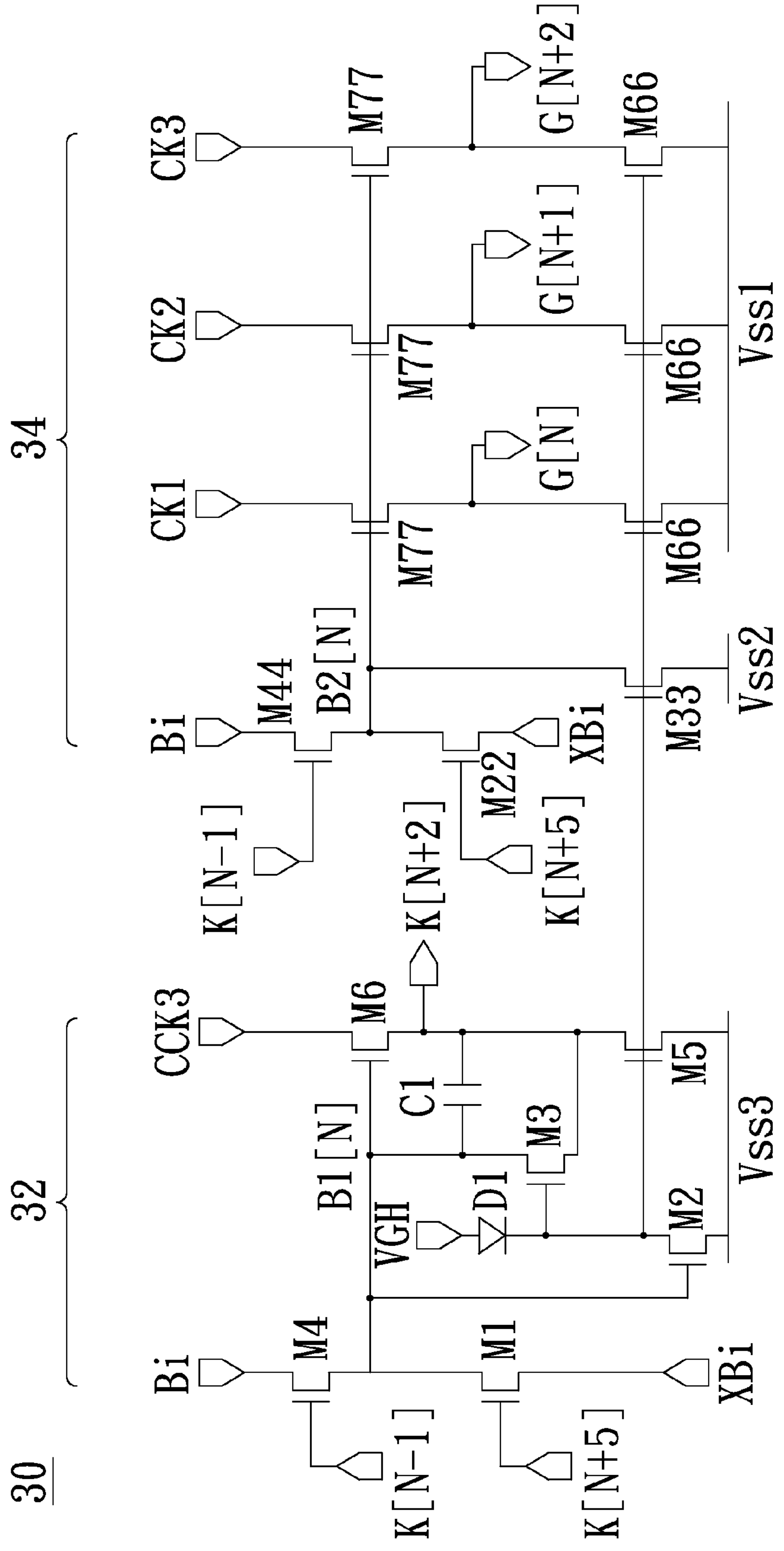
FIG. 3A is a schematic circuit view of a first register circuit adopted in a bidirectional shift register in accordance with of a second embodiment of the present disclosure.
Figure 3B:
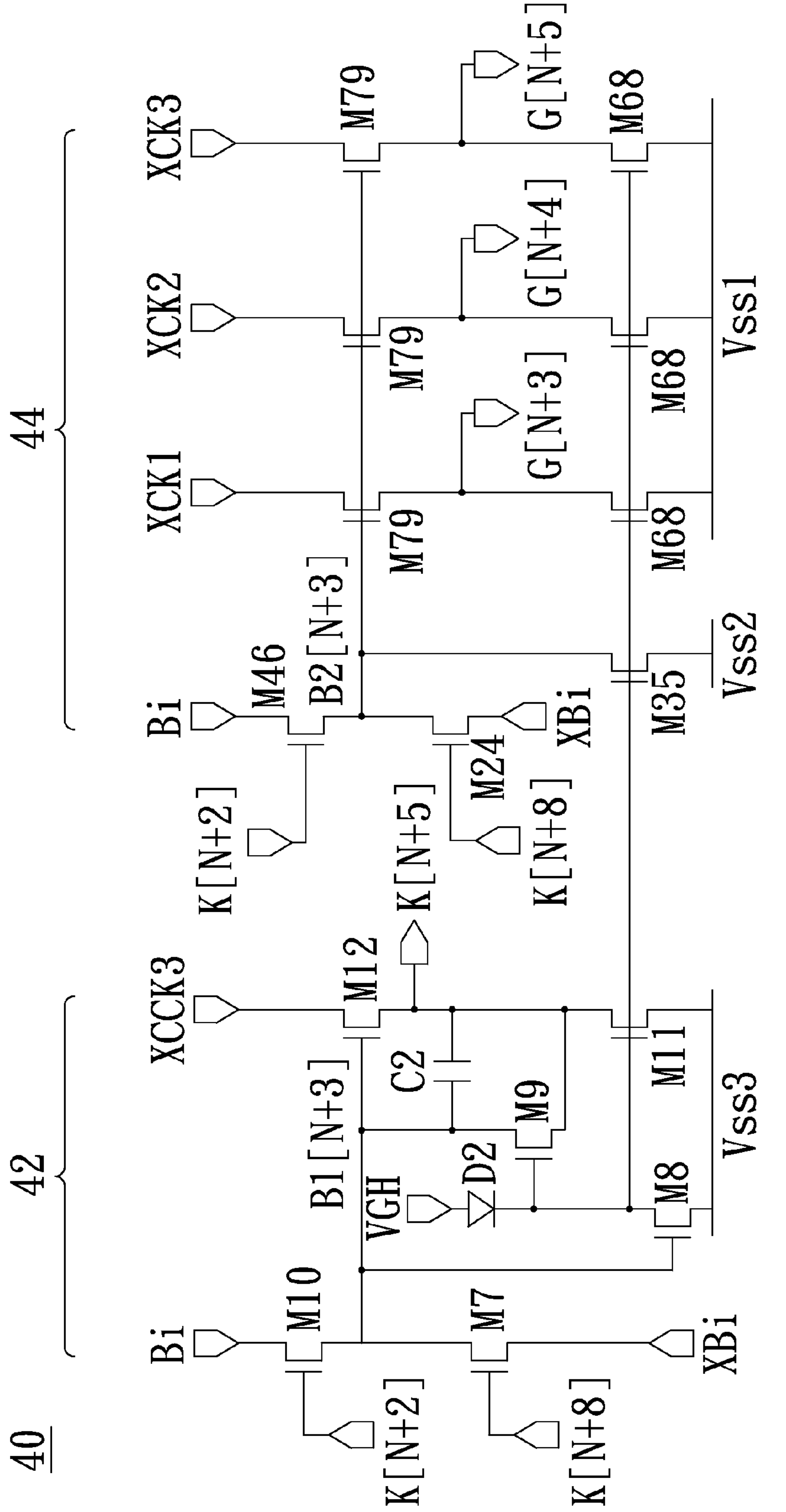
FIG. 3B is a schematic circuit view of a second register circuit adopted in the bidirectional shift register of the second embodiment.

FIG. 3A is a schematic circuit view of a first register circuit adopted in a bidirectional shift register in accordance with a second embodiment of the present disclosure; and FIG. 3B is a schematic circuit view of a second register circuit adopted in the bidirectional shift register in accordance with of the second embodiment of the present disclosure. Please refer to FIGS. 3A, 3B both. The first register circuit 30 and the second register circuit 40 in this embodiment respectively have circuit structures similar to the aforementioned first register circuit 10 and the second register circuit 20 in the first embodiment; the main difference between the two embodiments is that the first output buffer stage 34 and the second output buffer stage 44 in the second embodiment each have three stages (in other words, n=3), and no any unnecessary detail for the circuit connection relationship will be given here. As shown in FIG. 3A, the first register circuit 30, compared with the prior art that uses six clock signals for the generation of three scanning signals, can provide three scanning signals by using three clock signals only, and consequently the layout area is smaller and the power consumption is lower in this embodiment. In addition, the first register circuit 30 in another embodiment can provide twelve scanning signals by using six clock signals; and thus, the first register circuit 30 with this configuration has a further better performance than the prior art.

Figure 6A:
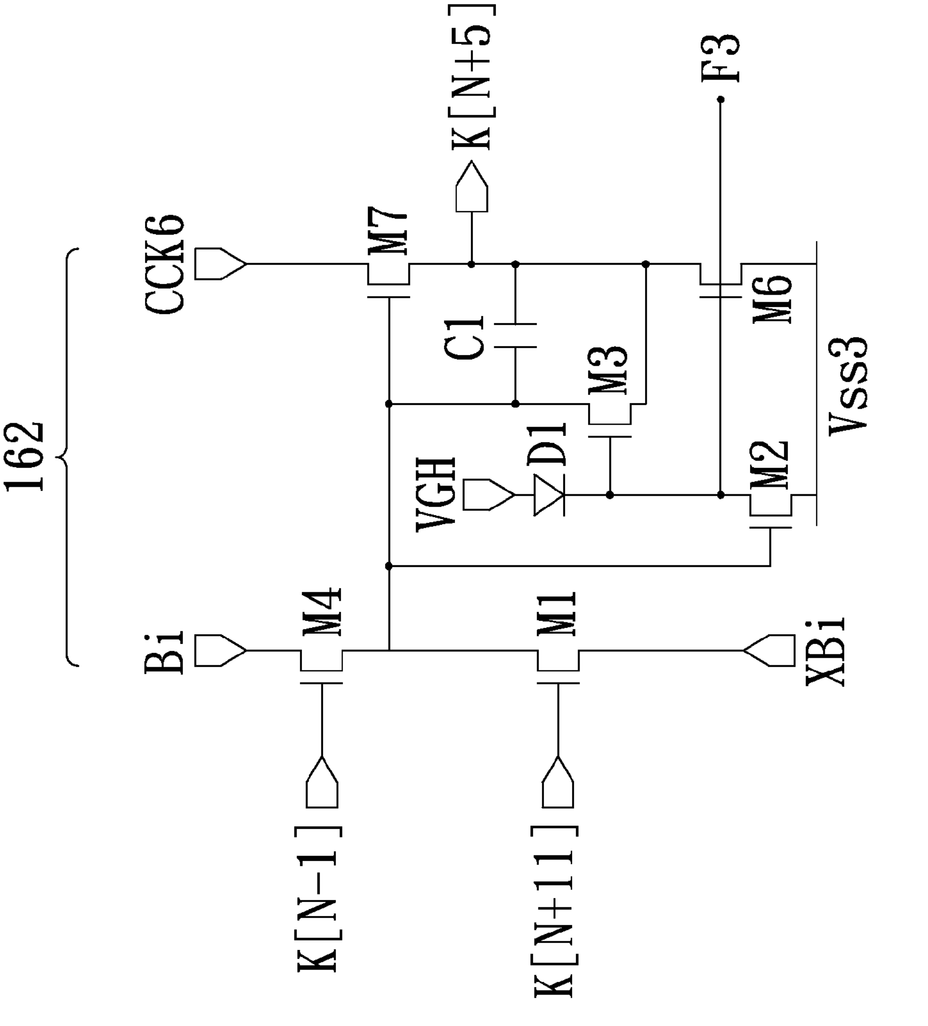
FIG. 6A is a schematic circuit view of a first register stage adopted in a bidirectional shift register in accordance with a fourth embodiment of the present disclosure.
Figure 6B:
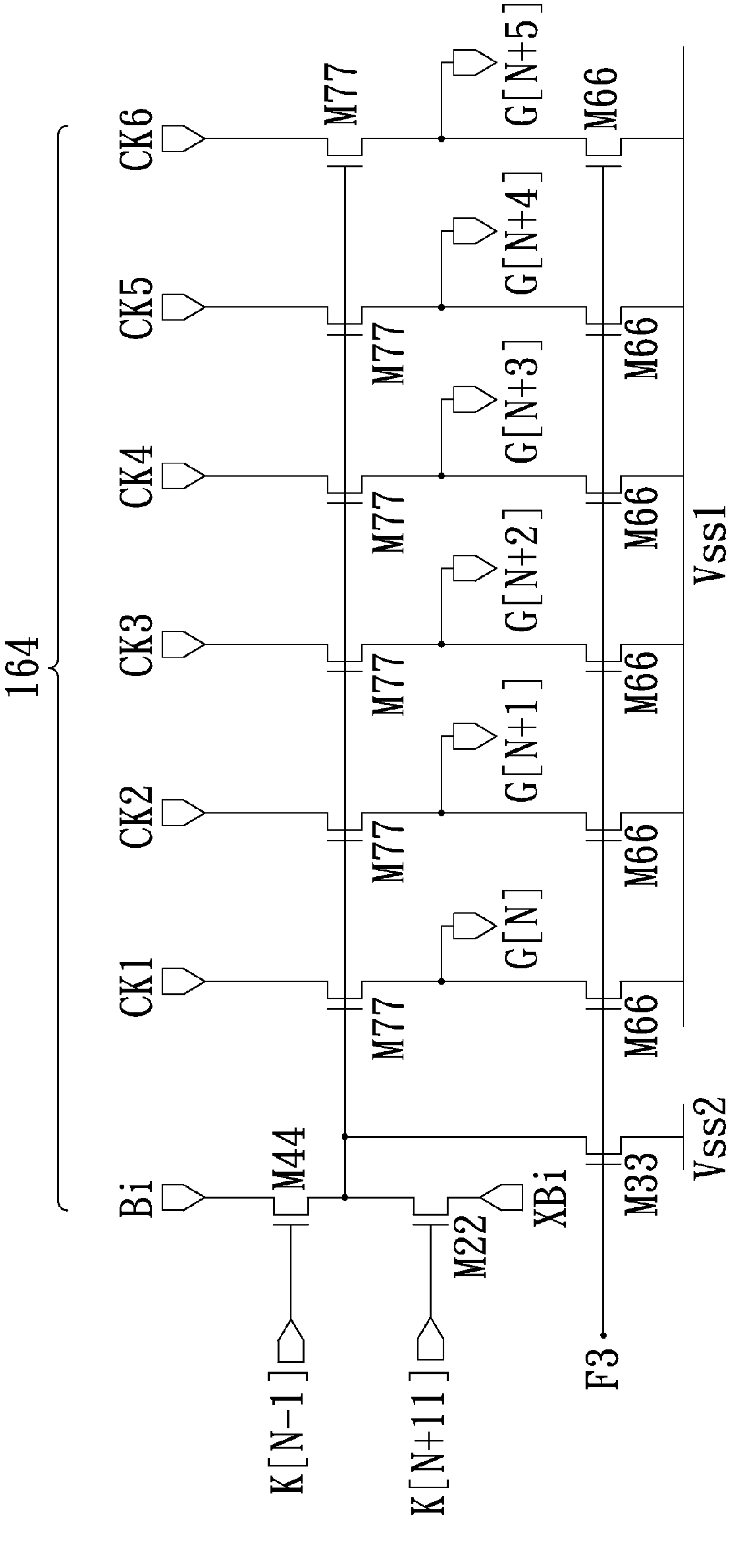
FIG. 6B is a schematic circuit view of a first output buffer stage adopted in the bidirectional shift register of the fourth embodiment.
Figure 6C:
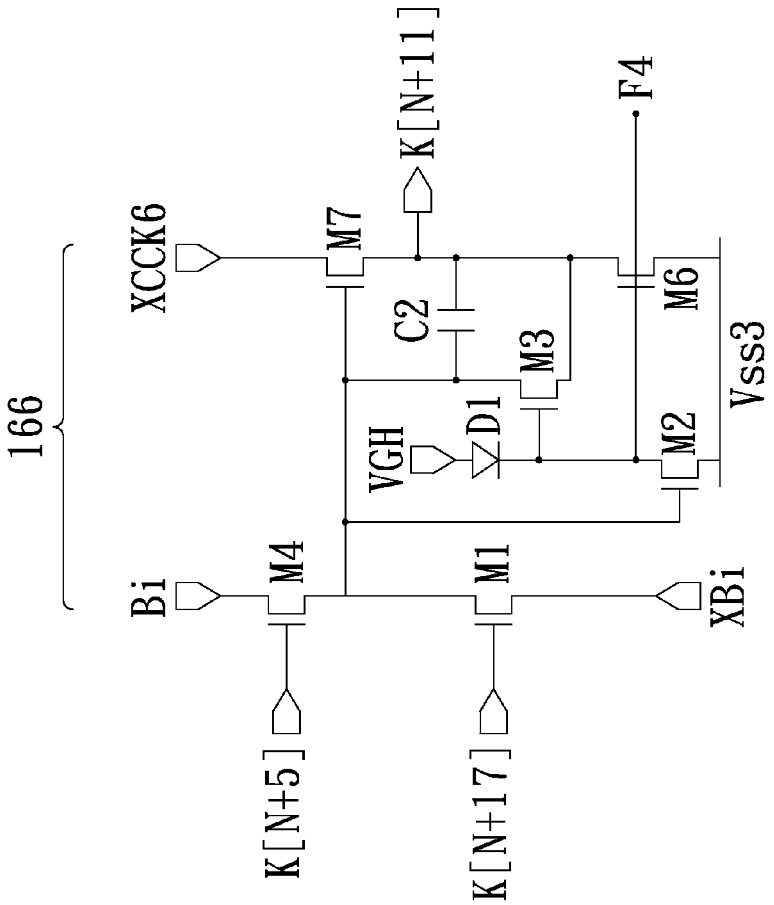
FIG. 6C is a schematic circuit view of a second register stage adopted in the bidirectional shift register of the fourth embodiment.

Besides, compared with requiring two clock signal lines in prior art (herein, the prior art also has three stages), the first register stage 32 of the second embodiment can use one clock signal line only. Based on the same manner, the first register stage 32 having six output buffer stages (as illustrated in FIGS. 6A, 6B) can save four clock signal lines, compared with the prior art also having six output buffer stages. As shown in FIGS. 3A, 3B, the transistors M22, M44 and M77 are operates in a reverse biased status while the first output buffer stage 34 is turned-off; and similarly, the transistors M24, M46 and M79 are operated in a reverse biased status while the first output buffer stage 44 is turned-off. And thus, the current leakage issue in the prior art is avoided and the noise interference is eliminated; and consequently the bidirectional shift register in this embodiment can have a reduced-size voltage regulator element therein. Then, the transistors M22, M33 and M66 are configured to block the current-leakage path while the first output buffer stage 34 is turned-on. Similarly, the transistors M24, M35 and M68 are configured to block the current-leakage path while the second output buffer stage 44 is turned-on. And thus, the bidirectional shift register in this embodiment can have a higher stability and lower power consumption.

In addition, the load connected to the first register circuit 30 and the second register circuit 40 is a light-load type, the first register circuit 30 and the second register circuit 40 each can have a significantly smaller layout area so as to meet the compact (lighter, thinner, shorter and smaller) design trend. Moreover, through having completely symmetrical circuit structure between the previous-stage and the next-stage registers, the bidirectional shift register in this embodiment can perform forward scanning operation and reverse scanning operation both by being supplied with bidirectional signals (i.e. the first control signal Bi, the second control signal XBi, the end stage clock signal, the complementary end stage clock signal, the clock signal and the complementary clock signal).

Figure 4A:
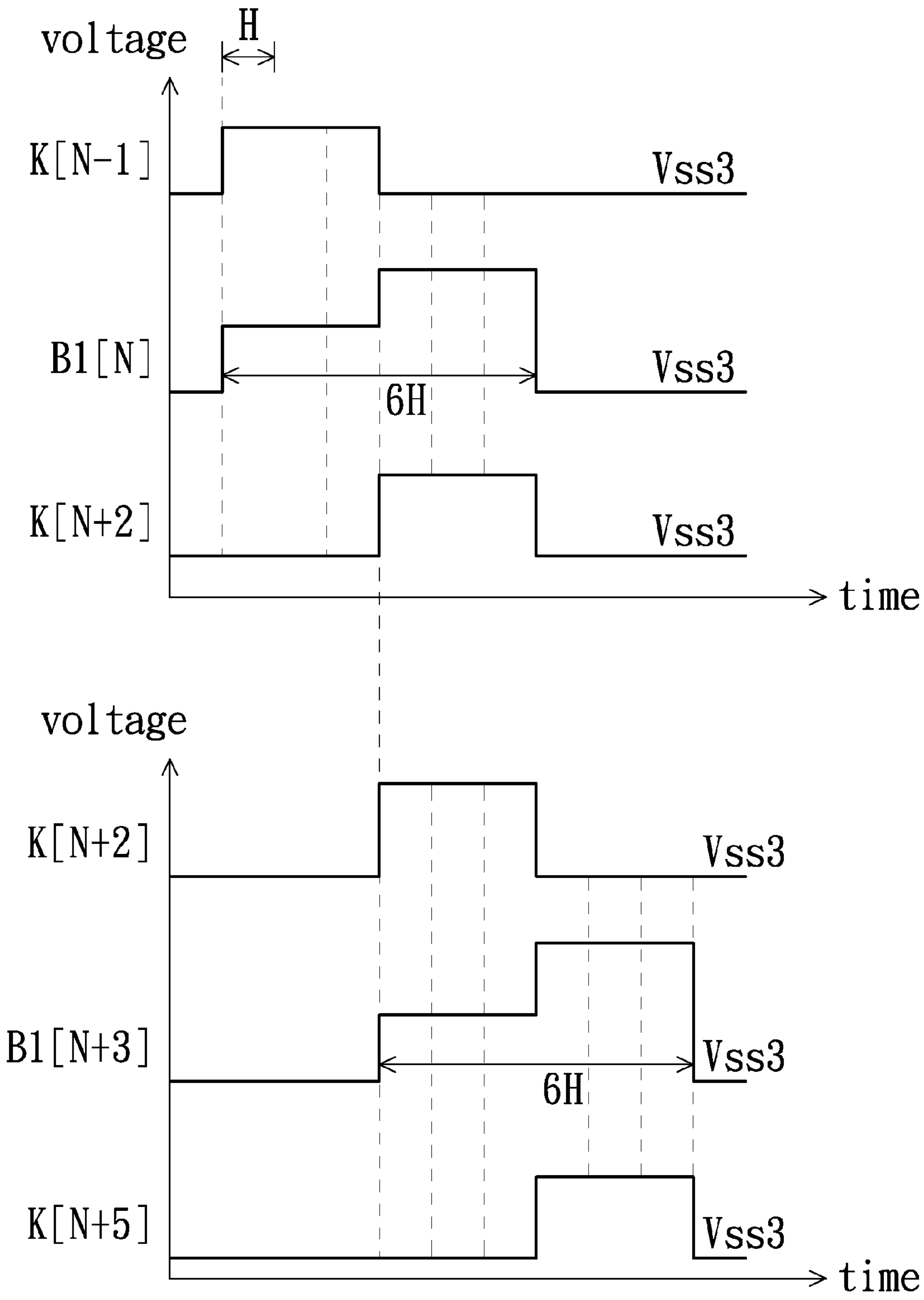
FIG. 4A is a schematic timing sequence view of the signals associated with the first register stage in the second embodiment.
Figure 4B:
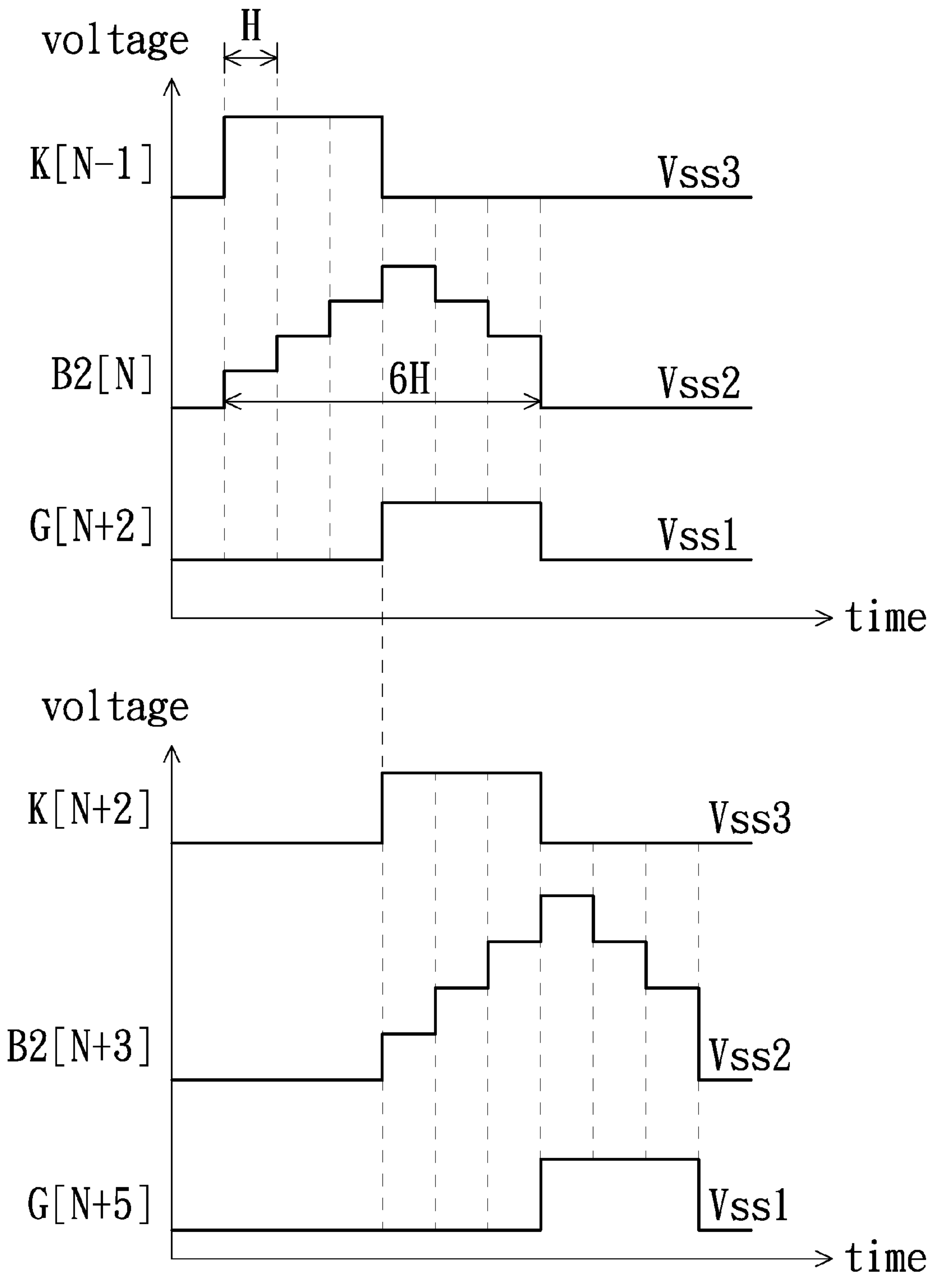
FIG. 4B is a schematic timing sequence view of the signals associated with the second register stage in the second embodiment.

Please refer to FIGS. 4A, 4B, which are schematic timing sequence view of the signals associated with the first register stage and the second register stage in the second embodiment, respectively. As shown in FIG. 4A, the three timing sequences are associated with the output end K[N−1] of the first register stage 32, the node B1[N] and the output end K[N+2], respectively; wherein the node B1 [N] is configured to have a pulse width of 6H, and H is a unit pulse width. Besides, the first clock signal CK1, the second clock signal CK2, the third clock signal CK3 and the end stage clock signal CCK3 (not shown) each are configured to have a pulse width of 3H. As shown in FIG. 4B, the node B2[N] and the node B3[N+3] each are configured to have a pulse width of 6H. Moreover, the complementary first clock signal XCK1, the complementary second clock signal XCK2, the complementary third clock signal XCK3 and the complementary end stage clock signal XCCK3 (not shown) each are configured to have a pulse width of 3H. In addition, while the bidirectional signal is turned-off, the node B2[N] and the node B2[N+3] are configured to have voltage level equal to that of the second voltage source Vss2, the node K[N−1] and the node K[N+2] are configured to have voltage level equal to that of the third voltage source Vss3, the output end G[N+2] and the output end G[N+5] are configured to have voltage level equal to that of the first voltage source Vss1.

Figure 5A:
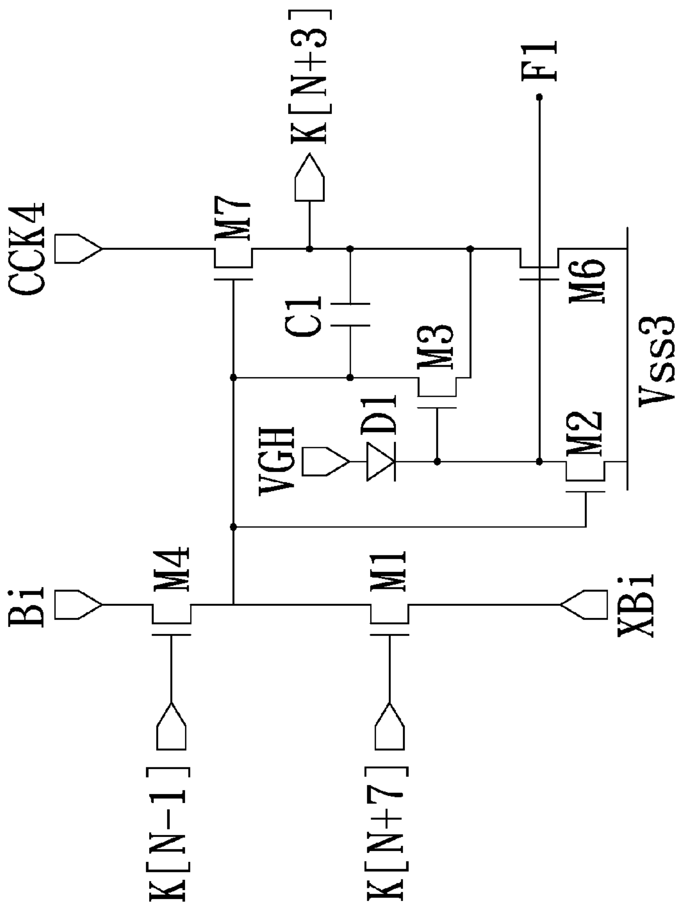
FIG. 5A is a schematic circuit view of a first register stage adopted in a bidirectional shift register in accordance with a third embodiment of the present disclosure.
Figure 5B:
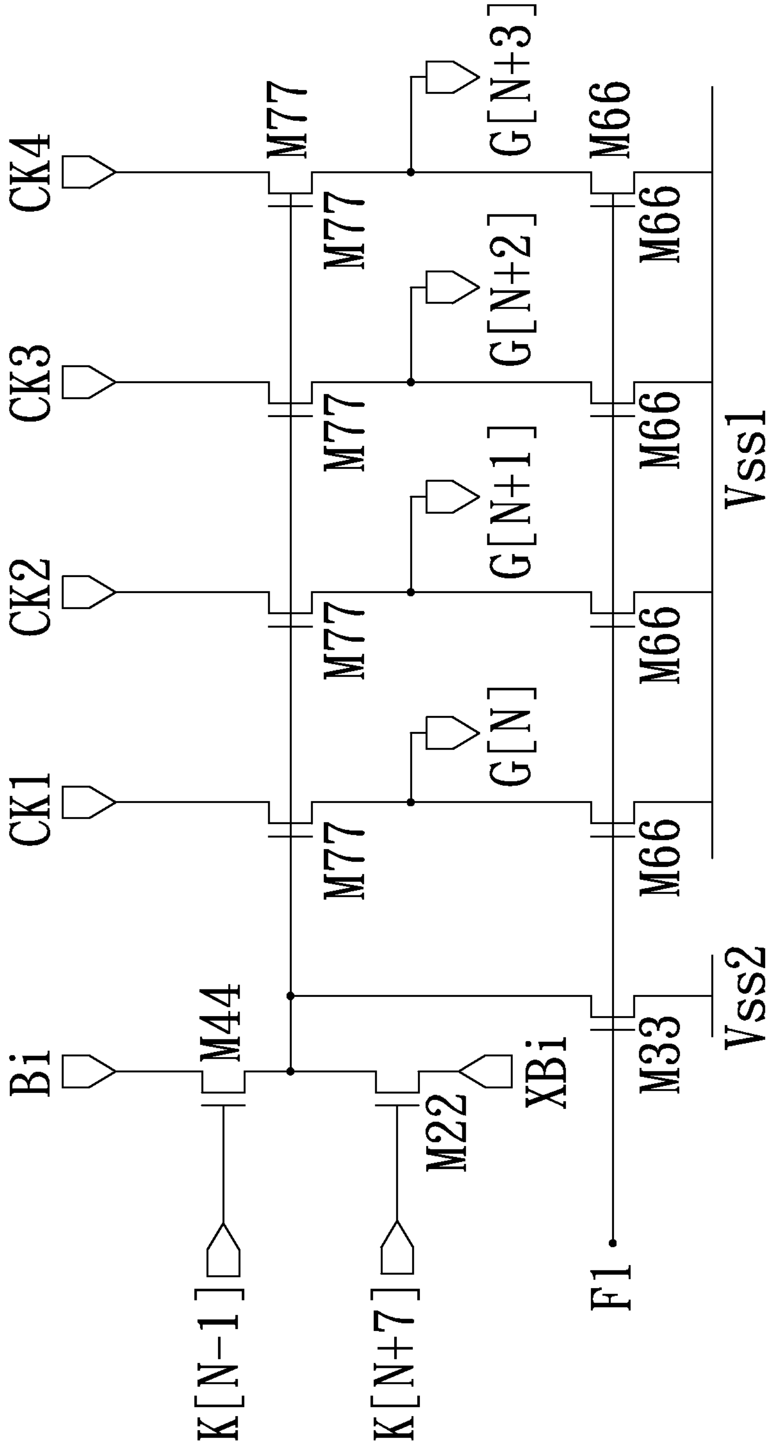
FIG. 5B is a schematic circuit view of a first output buffer stage adopted in the bidirectional shift register of the third embodiment.
Figure 5C:
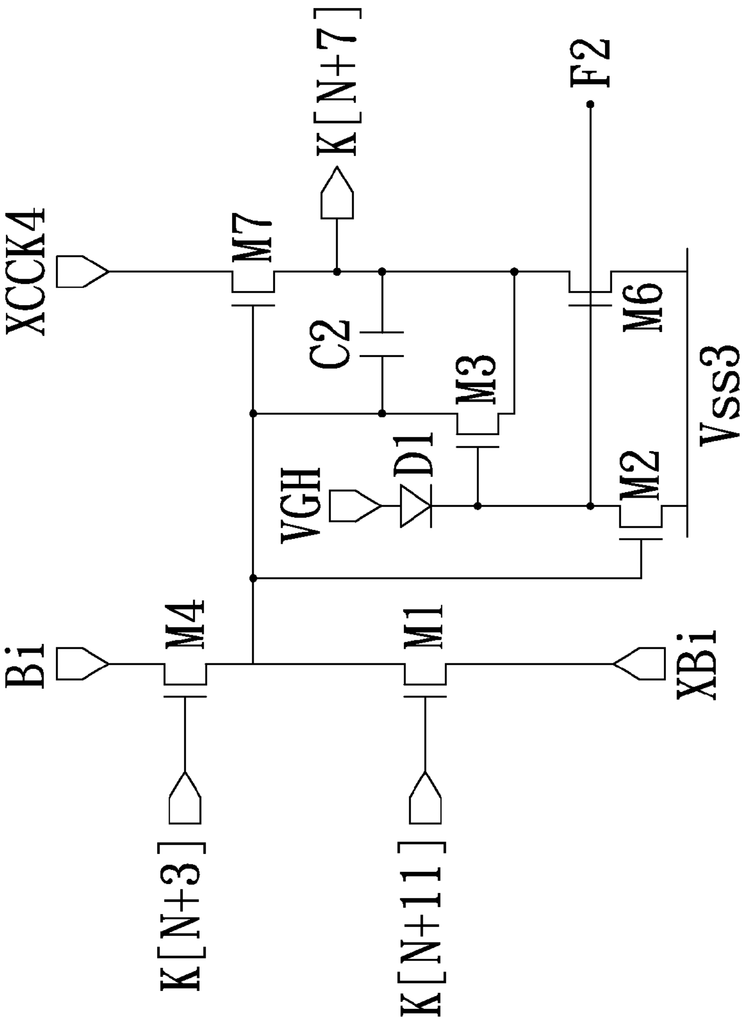
FIG. 5C is a schematic circuit view of a second register stage adopted in the bidirectional shift register of the third embodiment.
Figure 5D:
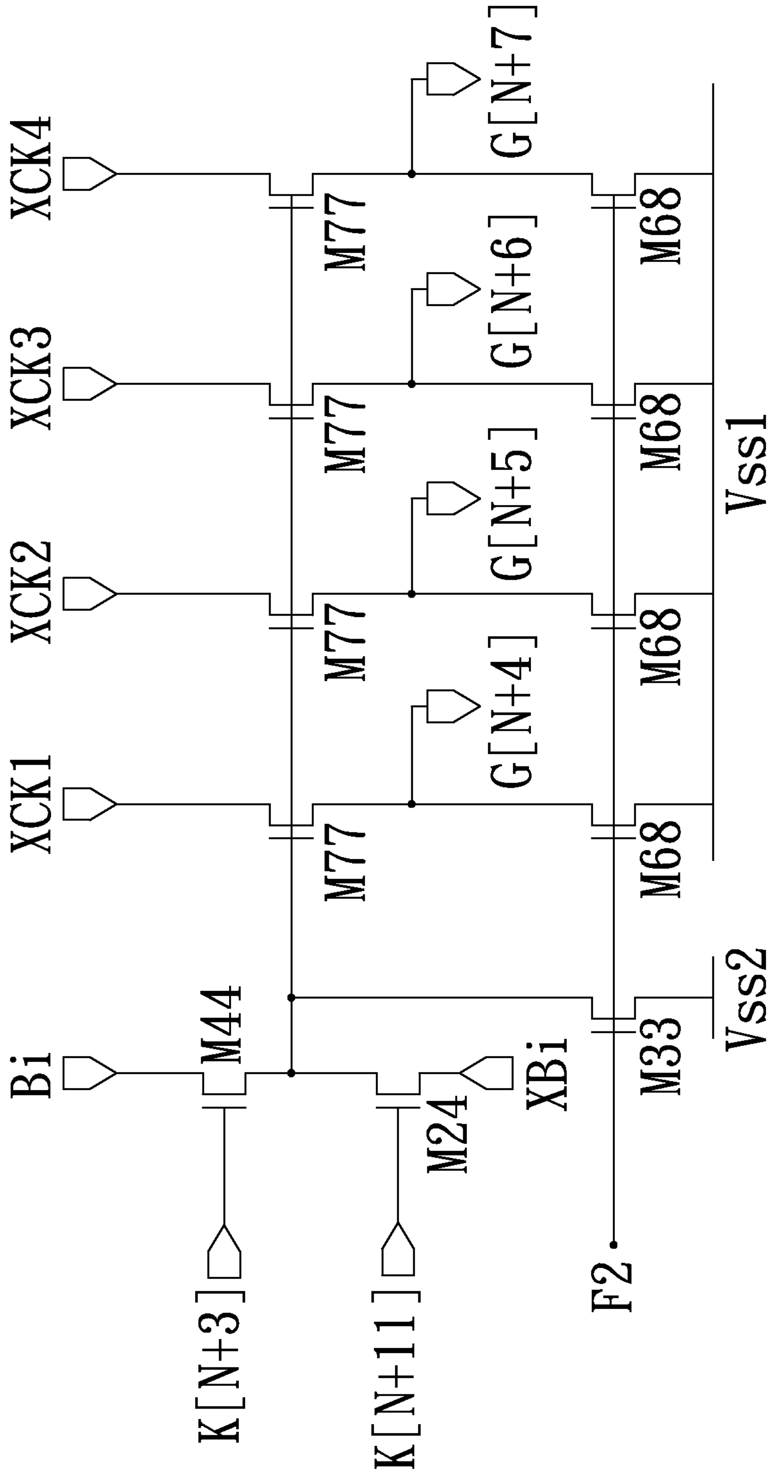
FIG. 5D is a schematic circuit view of a second output buffer stage adopted in the bidirectional shift register of the third embodiment.

FIGS. 5A, 5B, 5C and 5D are schematic circuit views of a first register stage, a first output buffer stage, a second register stage and a second output buffer stage adopted in the bidirectional shift register in accordance with of a third embodiment of the present disclosure, respectively. As shown, the first register stage in FIG. 5A and the first output buffer stage in FIG. 5B are electrically coupled to each other via the node F1; and the second register stage in FIG. 5C and the second output buffer stage in FIG. 5D are electrically coupled to each other via the node F2. The first register stage, the first output buffer stage, the second register stage and the second output buffer stage adopted in the third embodiment are configured to have circuit structures similar to those in the second embodiment; and the main difference between the two embodiments is that the bidirectional shift register in the third embodiment has four output buffer stages (in other words, n=4) and thereby no any unnecessary detail will be given here.

Figure 6D:
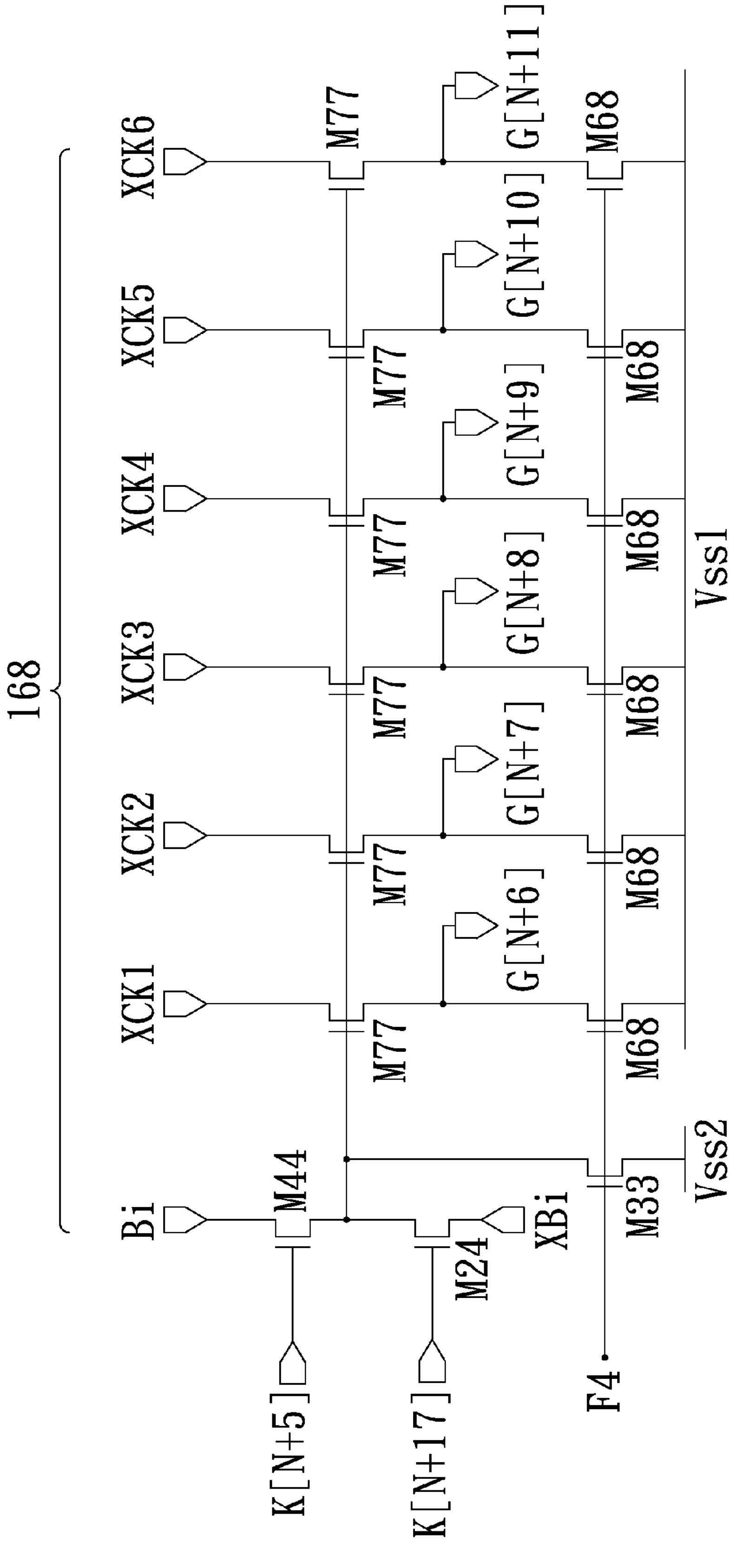
FIG. 6D is a schematic circuit view of a second output buffer stage adopted in the bidirectional shift register of the fourth embodiment.

FIGS. 6A, 6B, 6C and 6D are schematic circuit views of a first register stage, a first output buffer stage, a second register stage and a second output buffer stage adopted in the bidirectional shift register in accordance with of a fourth embodiment of the present disclosure, respectively. As shown, the first register stage in FIG. 6A and the first output buffer stage in FIG. 6B are electrically coupled to each other via the node F3; and the second register stage in FIG. 6C and the second output buffer stage in FIG. 6D are electrically coupled to each other via the node F4. The first register stage, the first output buffer stage, the second register stage and the second output buffer stage adopted in the fourth embodiment are configured to have circuit structures similar to those in the third embodiment; and the main difference between the two embodiments is that the bidirectional shift register in the fourth embodiment has six output buffer stages (in other words, n=6) and thereby no any unnecessary detail will be given here.

Figure 7:
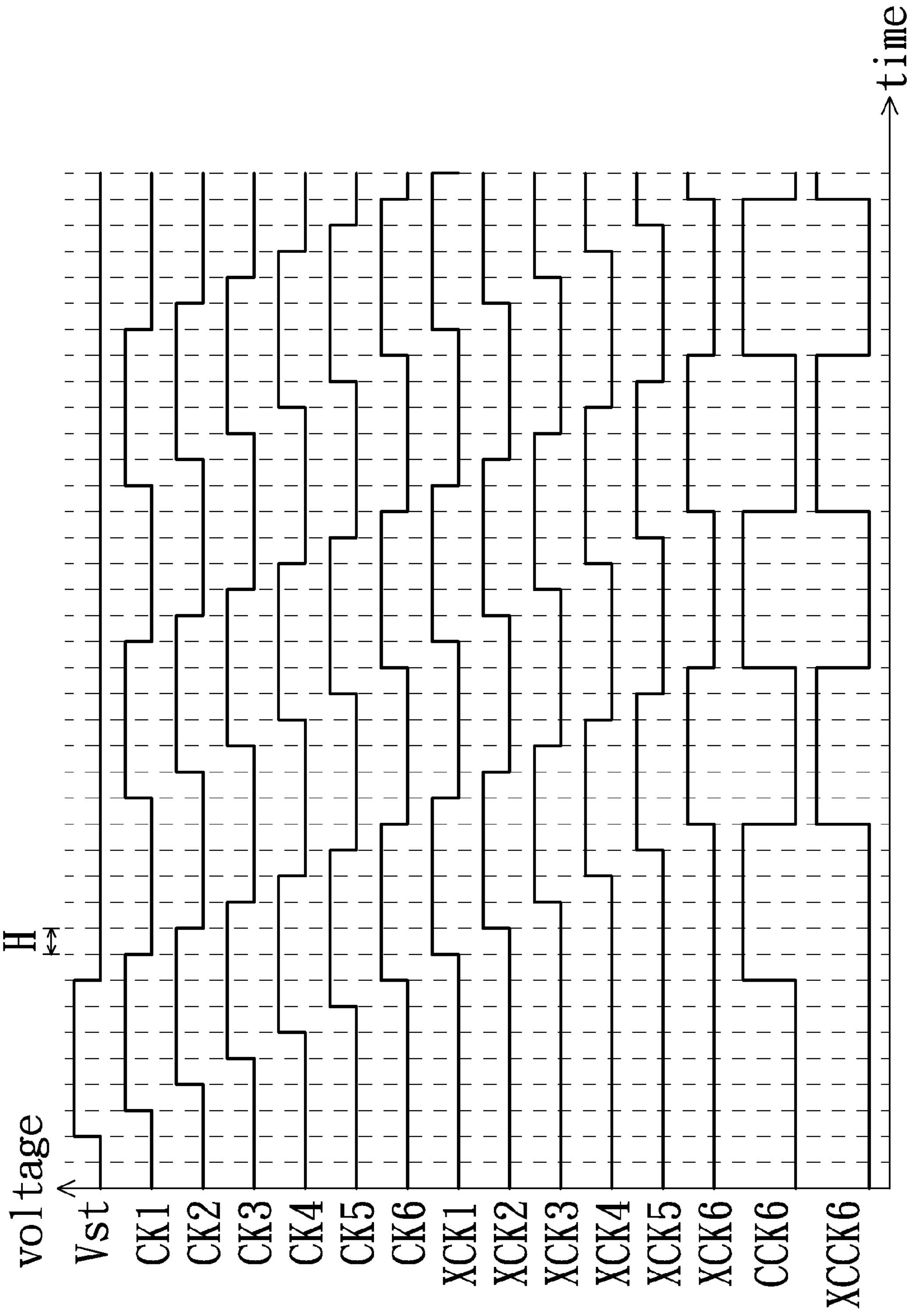
FIG. 7 is a schematic timing sequence view of the signals associated with the bidirectional shift register in the fourth embodiment.

Please refer to the FIG. 7, which is a schematic timing sequence view of the signals associated with the bidirectional shift register of the fourth embodiment. As shown, the first clock signal CK1, the second clock signal CK2, the third clock signal CK3, the fourth clock signal CK4, the fifth clock signal CK5 and the sixth clock signal CK6 each are configured to have a pulse width of 6H; wherein the second clock signal CK2 is configured to have 1H lag behind the first clock signal CK1, and so forth. Moreover, the first complementary clock signal XCK1 and the first clock signal CK1 are reverse (or, complementary) to each other; the second complementary clock signal XCK2 and the second clock signal CK2 are reverse (or, complementary) to each other, and so forth. In addition, the first clock signal CK1, the second clock signal CK2, the third clock signal CK3, the fourth clock signal CK4, the fifth clock signal CK5, the sixth clock signal CK6, the complementary first clock signal XCK1, the complementary second clock signal XCK2, the complementary third clock signal XCK3, the complementary fourth clock signal XCK4, the complementary fifth clock signal XCK5 and the complementary sixth clock signal XCK6 each are configured to have a voltage level equal to that of the first voltage source Vss1.

It is to be noted that the end stage clock signal CCK6 and the sixth clock signal CK6 are configured to have a same phase but have a different logic-low level. For example, the end stage clock signal CCK6 has a logic-low level equal to the voltage level of the third voltage source Vss3, and the sixth clock signal CK6 has a logic-low level equal to the voltage level of the first voltage source Vss1. Moreover, the complementary end stage clock signal XCCK6 and the end stage clock signal CCK6 are reverse (or, complementary) to each other so as to form a symmetrical signal control sequence.

Figure 8:
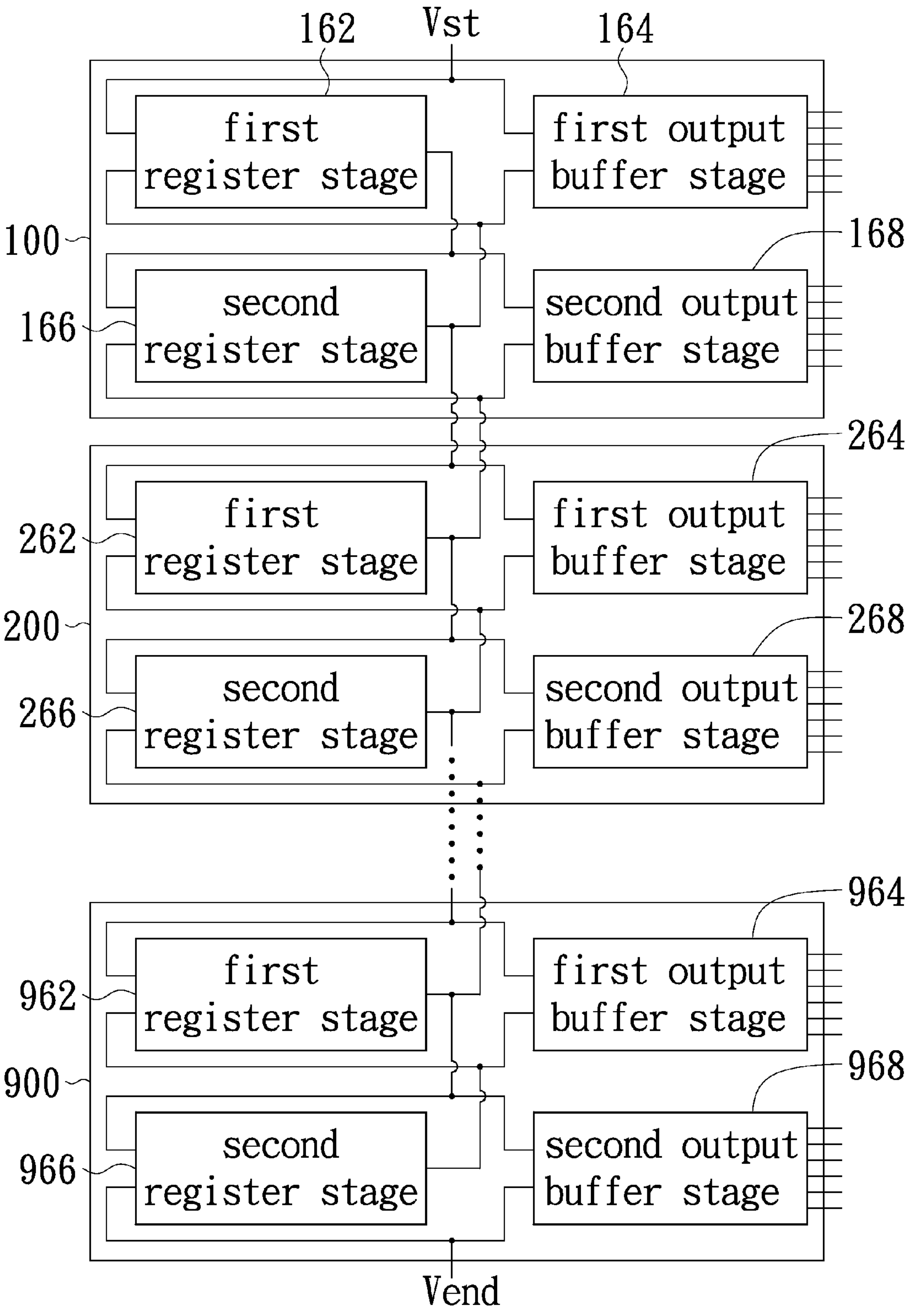
FIG. 8 is a schematic view illustrating a connection relationship between a plurality of bidirectional shift registers of the present disclosure.

Please refer to FIG. 8, which is a schematic view illustrating a connection relationship between a plurality of bidirectional shift registers of the present disclosure; wherein it is to be noted that the FIG. 8 is exemplified by nine bidirectional shift registers. As shown, the bidirectional shift register 100 includes a first register stage 162, a first output buffer stage 164, a second register stage 166 and a second output buffer stage 168. The bidirectional shift register 200 includes a first register stage 262, a first output buffer stage 264, a second register stage 266 and a second output buffer stage 268. Based on the same manner, the bidirectional shift register 900 includes a first register stage 962, a first output buffer stage 964, a second register stage 966 and a second output buffer stage 968.

The first end of the first register stage 162 and the first end of the first output buffer stage 164 each are configured to receive the clock signal Vst. The second end of the first register stage 162 and the second end of the first output buffer stage 164 each are electrically coupled to the output end of the second register stage 166.

The first end of the second register stage 166 and the first end of the second output buffer stage 168 are electrically coupled to the output end of the first register stage 162. The second end of the second register stage 166 and the second end of the second output buffer stage 168 are electrically coupled to the output end of the first register stage 262 of the bidirectional shift register 200.

Based on the same manner, the first end of the first register stage 262 and the first end of the first output buffer stage 264 each are electrically coupled to the output end of the second register stage 166. The second end of the first register stage 262 and the second end of the first output buffer stage 264 each are electrically coupled the output end of the second register stage 266.

The first end of the second register stage 266 and the first end of the second output buffer stage 268 each are electrically coupled to the output end of the first register stage 262. The second end of the second register stage 266 and the second end of the second output buffer stage 268 each are electrically coupled the output end of the first register stage of the next-stage bidirectional shift register. Because being electrically coupled in series, the bidirectional shift registers 100, 200 . . . and 900 can have a symmetrical circuit structure.

To sum up, through the symmetrical circuit structure and the specific signal control sequence, the bidirectional shift register and the driving method thereof according to the present disclosure can have a bidirectional operation feature. In addition, the bidirectional shift register according to the present disclosure can have lower power consumption and a smaller layout area due to the register stage using one clock signal line only. Moreover, because the leakage current path can be blocked when the output buffer stage is operated in a reverse biased status, and consequently the bidirectional shift register according to the present disclosure can have a higher stability.

While the disclosure has been described in terms of what is presently considered to be the most practical and preferred embodiments, it is to be understood that the disclosure doesn't need to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A bidirectional shift register, comprising:

a first register circuit comprising:

a first register stage having a first end, a second end and an output end, wherein the first end of the first register stage is electrically coupled to an output end of a second register stage of a previous-stage bidirectional register shift register, the first register stage is configured to receive a first control signal, a second control signal and an end stage clock signal, the first register stage is electrically coupled to a third voltage source; and a first output buffer stage electrically coupled to the first register stage and having a first end, a second end and n numbers of scanning signal output ends, wherein the first end of the first output buffer stage is electrically coupled to the first end of the first register stage, the second end of the first output buffer stage is electrically coupled to the second end of the first register stage, the first output buffer stage is further electrically coupled to a first voltage source and a second voltage source; and a second register circuit comprising:

a second register stage having a first end, a second end and an output end, wherein the first end of the second register stage is electrically coupled to the output end of the first register stage, the second end of the second register stage is electrically coupled to an output end of a first register stage of a next-stage bidirectional shift register, the output end of the second register stage is electrically coupled to the second end of the first register stage and a first end of the first register stage of the next-stage bidirectional shift register, the second register stage is configured to receive the first control signal, the second control signal and a complementary end stage clock signal, the second register stage is further electrically coupled to the third voltage source; and a second output buffer stage electrically coupled to the second register stage and having a first end, a second end and n numbers of scanning signal output ends, wherein the first end of the second output buffer stage is electrically coupled to the first end of the second register stage, the second end of the second output buffer stage is electrically coupled to the second end of the second register stage, the second output buffer stage is further electrically coupled to the first voltage source and the second voltage source;

wherein the first register circuit and the second register circuit each use n+1 numbers of clock signal lines, and n is a positive integer.

2. The bidirectional shift register according to claim 1, wherein the first voltage source is configured to have a voltage level greater than the second voltage source has, the second voltage source is configured to have a voltage level greater than the third voltage source has.

3. The bidirectional shift register according to claim 1, wherein the first output buffer stage is further configured to receive the first control signal, the second control signal, a first clock signal, a second clock signal, . . . and a nth clock signal; the second output buffer stage is further configured to receive the first control signal, the second control signal and a complementary first clock signal, a complementary second clock signal, . . . and a complementary nth clock signal; wherein the first clock signal, the second clock signal, . . . and the nth clock signal are complementary to the complementary first clock signal, the complementary second clock signal, . . . and the complementary nth clock signal, respectively.

4. The bidirectional shift register according to claim 3, wherein the first clock signal, the second clock signal, . . . and the nth clock signal each are configured to have a pulse width proportional to the stage number of the first output buffer stage; and the complementary first clock signal, the complementary second clock signal, . . . and the complementary nth clock signal each are configured to have a pulse width proportional to the stage number of the second output buffer stage.

5. The bidirectional shift register according to claim 3, wherein the first clock signal, the second clock signal, . . . and the nth clock signal, the complementary first clock signal, the complementary second clock signal, . . . and the complementary nth clock signal each are configured to have a logic-low level equal to the voltage level of the first voltage source;

wherein the end stage clock signal and the complementary end stage clock signal each are configured to have a logic-low level equal to the voltage level of the third voltage source.

6. The bidirectional shift register according to claim 3, wherein the first register stage comprises:

a first transistor having a drain terminal, a gate terminal and a source terminal, wherein the gate terminal of the first transistor is electrically coupled to the second end of the first register stage, the source terminal of the first transistor is configured to receive the second control signal;

a second transistor having a drain terminal, a gate terminal and a source terminal, wherein the gate terminal of the second transistor is electrically coupled to the drain terminal of the first transistor, the source terminal of the second transistor is electrically coupled to the third voltage source;

a third transistor having a drain terminal, a gate terminal and a source terminal, wherein the drain terminal of the third transistor is electrically coupled to the drain terminal of the first transistor, the gate terminal of the third transistor is electrically coupled to the drain terminal of the second transistor;

a fourth transistor having a drain terminal, a gate terminal and a source terminal, wherein the drain terminal of the fourth transistor is configured to receive the first control signal, the gate terminal of the fourth transistor is electrically coupled to the output end of the second register stage of the previous-stage bidirectional shift register, the source terminal of the fourth transistor is electrically coupled to the drain terminal of the first transistor;

a fifth transistor having a drain terminal, a gate terminal and a source terminal, wherein the drain terminal of the fifth transistor is electrically coupled to the source terminal of the third transistor, the gate terminal of the fifth transistor is electrically coupled to the drain terminal of the second transistor, the source terminal of the fifth transistor is electrically coupled to the third voltage source;

a sixth transistor having a drain terminal, a gate terminal and a source terminal, wherein the drain terminal of the sixth transistor is configured to receive the end stage clock signal, the gate terminal of the sixth transistor is electrically coupled to the drain terminal of the third transistor, the source terminal of the sixth transistor is electrically coupled to the drain terminal of the fifth transistor; and a first diode having a positive end and a negative end, wherein the positive end of the first diode is configured to receive a first voltage, the negative end of the first diode is electrically coupled to the gate terminal of the third transistor;

wherein the second register stage comprises:

a seventh transistor having a drain terminal, a gate terminal and a source terminal, wherein the gate terminal of the seventh transistor is electrically coupled to the second end of the second register stage, the source terminal of the seventh transistor is configured to receive the second control signal;

an eighth having a drain terminal, a gate terminal and a source terminal, wherein the gate terminal of the eighth transistor is electrically coupled to the drain terminal of the first transistor, the source terminal of the eighth transistor is electrically coupled to the third voltage source;

a ninth transistor having a drain terminal, a gate terminal and a source terminal, wherein the drain terminal of the ninth transistor is electrically coupled to the drain terminal of the seventh transistor, the gate terminal of the ninth transistor is electrically coupled to the drain terminal of the eighth transistor;

a tenth transistor having a drain terminal, a gate terminal and a source terminal, wherein the drain terminal of the tenth transistor is configured to receive the first control signal, the gate terminal of the tenth transistor is electrically coupled to the output end of the first register stage, the source terminal of the tenth transistor is electrically coupled to the drain terminal of the seventh transistor;

an eleventh transistor having a drain terminal, a gate terminal and a source terminal, wherein the drain terminal of the eleventh transistor is electrically coupled to the source terminal of the ninth transistor and the output end of the second register stage, the gate terminal of the eleventh transistor is electrically coupled to the drain terminal of the eighth transistor, the source terminal of the eleventh transistor is electrically coupled to the third voltage source;

a twelfth transistor having a drain terminal, a gate terminal and a source terminal, wherein the drain terminal of the twelfth transistor is configured to receive the complementary end stage clock signal, the gate terminal of the twelfth transistor is electrically coupled to the drain terminal of the ninth transistor, the source terminal of the twelfth transistor is electrically coupled to the drain terminal of the eleventh transistor; and a second diode having a positive end and a negative end, wherein the positive end of the second diode is configured to receive the first voltage, the negative end of the second diode is electrically coupled to the gate terminal of the ninth transistor.

7. The bidirectional shift register according to claim 6, wherein the first register stage further comprises a first capacitor having a first end and a second end, the first end of the first capacitor is electrically coupled to the source terminal of the sixth transistor, the second end of the first capacitor is electrically coupled to the drain terminal of the third transistor; wherein the second register stage further comprises a second capacitor having a first end and a second end, the first end of the second capacitor is electrically coupled to the source terminal of the twelfth transistor, the second end of the second capacitor is electrically coupled to the drain terminal of the ninth transistor.

8. The bidirectional shift register according to claim 6, wherein first output buffer stage comprises:

a thirteenth transistor having a drain terminal, a gate terminal and a source terminal, wherein the gate terminal of the thirteenth transistor is electrically coupled to the second end of the first register stage, the source terminal of the thirteenth transistor is configured to receive the second control signal;

a fourteenth transistor having a drain terminal, a gate terminal and a source terminal, wherein the drain terminal of the fourteenth transistor is electrically coupled to the drain terminal of the thirteenth transistor, the gate terminal of the fourteenth transistor is electrically coupled to the gate terminal of the fifth transistor of the first register stage, the source terminal of the fourteenth transistor is electrically coupled to the second voltage source;

a fifteenth transistor having a drain terminal, a gate terminal and a source terminal, wherein the drain terminal of the fifteenth transistor is configured to receive the first control signal, the gate terminal of the fifteenth transistor is electrically coupled to the first end of the first register stage, the source terminal of the fifteenth transistor is electrically coupled to the drain terminal of the fourteenth transistor; and wherein each scanning signal output end is constituted by a sixteenth transistor and a seventeenth transistor, each sixteenth transistor is configured to have its gate terminal electrically coupled to the gate terminal of the fourteenth transistor, its source terminal electrically coupled to the first voltage source; the seventeenth transistors are configured to have the drain terminals respectively receiving the first clock signal, the second clock signal, . . . and the nth clock signal, each seventeenth transistor is configured to have its gate terminal electrically coupled the source terminal of the fifteenth transistor, and its source terminal electrically coupled to the drain terminal of the associated sixteen transistor;

wherein the second output buffer stage comprise:

an eighteenth transistor having a drain terminal, a gate terminal and a source terminal, wherein the gate terminal of the eighteenth transistor is electrically coupled to the second end of the second register stage, the source terminal of the eighteenth transistor is configured to receive the second control signal;

a nineteenth transistor having a drain terminal, a gate terminal and a source terminal, wherein the drain terminal of the nineteenth transistor is electrically coupled to the drain terminal of the eighteenth transistor, the gate terminal of the nineteenth transistor is electrically coupled to the gate terminal of the eleventh transistor of the second register stage, the source terminal of the nineteenth transistor is electrically coupled to the second voltage source;

a twentieth transistor having a drain terminal, a gate terminal and a source terminal, wherein the drain terminal of the twentieth transistor is configured to receive the first control signal, the gate terminal of the twentieth transistor is electrically coupled to the first end of the second register stage, the source terminal of the twentieth transistor is electrically coupled to the drain terminal of the eighteenth transistor;

wherein each scanning signal output end comprises a twenty-first transistor and a twenty-second transistor, each twenty-first transistor is configured to have its gate terminal electrically coupled to the gate terminal of the nineteenth transistor, and its source terminal electrically coupled to the first voltage source; the twenty-second transistors are configured to have the drain terminals respectively receiving the complementary first clock signal, the complementary second clock signal, . . . and the complementary nth clock signal, each twenty-second transistor is configured to have its gate terminal electrically coupled the source terminal of the twenty transistor, and its source terminal electrically coupled to the drain terminal of the associated twenty-first transistor.

9. A bidirectional shift register, comprising:

a register stage having a first end and a second end, wherein the first end of the register stage is electrically coupled an output end of a previous-stage register, the second end of the register stage is electrically coupled to a first end of a next-stage register, the register stage is configured to receive a first control signal, a second control signal and an end stage clock signal, the register stage is further electrically coupled to a third voltage source, and the register stage uses one clock signal line; and an output buffer stage electrically coupled to the register stage and having a first end, a second end and a scanning signal output end, wherein the first end of the output buffer stage is electrically coupled to the first end of the register stage, the second end of the output buffer stage is electrically coupled to the second end of the register stage, the output buffer stage is electrically coupled to a first voltage source and a second voltage source.

10. The bidirectional shift register according to claim 9, wherein the first voltage source is configured to have a voltage level greater than the second voltage source has, the second voltage source is configured to have a voltage level greater than the third voltage source has.

11. The bidirectional shift register according to claim 9, wherein the output buffer stage is further configured to receive the first control signal, the second control signal and a first clock signal having a phase same as the end stage clock signal has.

12. A driving method of a bidirectional shift register for driving a plurality of bidirectional shift registers therein, each bidirectional shift register comprising a first register circuit and a second register circuit, the driving method comprising:

providing a first voltage source, a second voltage source, a third voltage source, a first control signal and a second control signal;

defining the first register circuit into a first register stage and a first output buffer stage with n numbers of scanning signal output ends, and defining the second register circuit into a second register stage and a second output buffer stage with n numbers of scanning signal output ends; and electrically coupling the first end of the first register stage to the output end of the second register stage of a previous-stage bidirectional shift register; electrically coupling the first register stage to the third voltage source; configuring the first register stage to receive the first control signal, the second control signal and a complementary nth clock signal; electrically coupling the first end of the first output buffer stage to the first end of the first register stage; electrically coupling the second end of the first output buffer stage to the second end of the first register stage; electrically coupling the first output buffer stage to the second voltage and the first voltage source; electrically coupling the first end of the second register stage to the output end of the first register stage; electrically coupling the second end of the second register stage to the output end of the first register of a next-stage bidirectional shift register; electrically coupling the second register stage to the third voltage source; configuring the second register stage to receive the first control signal, the second control signal and a nth clock signal; electrically coupling the first end of the second output buffer stage to the first end of the second register stage; electrically coupling the second end of the second output buffer stage to the second end of the first register stage; electrically coupling the output end of the second register stage to the second end of the first register stage and the first end of the first register stage of the next-stage bidirectional shift register; electrically coupling the second output buffer stage to the second voltage source and the first voltage source;

wherein the first register circuit and the second register circuit each use n+1 numbers of clock signal lines, and n is a positive integer.

13. The driving method of a bidirectional shift register according to claim 12, wherein the first voltage source is configured to have a voltage level greater than the second voltage source has, the second voltage source is configured to have a voltage level greater than the third voltage source has.

14. The driving method of a bidirectional shift register according to claim 12, wherein the first output buffer stage is further configured to receive the first control signal, the second control signal, a first clock signal, a second clock signal, . . . and a nth clock signal; the second output buffer stage is further configured to receive the first control signal, the second control signal and a complementary first clock signal, a complementary second clock signal, . . . and a complementary nth clock signal; wherein the first clock signal, the second clock signal, . . . and the nth clock signal are complementary to the complementary first clock signal, the complementary second clock signal, . . . and the complementary nth clock signal, respectively.

15. The driving method of a bidirectional shift register according to claim 14, wherein the first clock signal, the second clock signal, . . . and the nth clock signal each are configured to have a pulse width proportional to the stage number of the first output buffer stage; and the complementary first clock signal, the complementary second clock signal, . . . and the complementary nth clock signal each are configured to have a pulse width proportional to the stage number of the second output buffer stage.

16. The driving method of a bidirectional shift register according to claim 14, wherein the first clock signal, the second clock signal, . . . and the nth clock signal, the complementary first clock signal, the complementary second clock signal, . . . and the complementary nth clock signal each are configured to have a logic-low level equal to the voltage level of the first voltage source; wherein the end stage clock signal and the complementary end stage clock signal each are configured to have a logic-low level equal to the voltage level of the third voltage source.

* * * * *